US012615859B2

(12) United States Patent
Na et al.

(10) Patent No.: US 12,615,859 B2
(45) Date of Patent: Apr. 28, 2026

(54) PHOTO-DETECTING APPARATUS

(71) Applicant: Artilux, Inc., Menlo Park, CA (US)

(72) Inventors: Yun-Chung Na, San Jose, CA (US);
Chien-Yu Chen, Zhubei (TW);
Ming-Jay Yang, Zhubei (TW);
Jung-Chin Chiang, Menlo Park, CA
(US); Yen-Cheng Lu, Zhubei (TW)

(73) Assignee: Artilux, Inc., Menlo Park, CA (US)

( * ) Notice: Subject to any disclaimer, the term of this
patent is extended or adjusted under 35
U.S.C. 154(b) by 969 days.

(21) Appl. No.: 17/699,546

(22) Filed: Mar. 21, 2022

(65) Prior Publication Data

US 2022/0310685 A1      Sep. 29, 2022

Related U.S. Application Data

(60) Provisional application No. 63/221,945, filed on Jul.
15, 2021, provisional application No. 63/165,203,
filed on Mar. 24, 2021.

(51) Int. Cl.
*H10F 39/00*          (2025.01)
*G01S 7/481*          (2006.01)
*G01S 17/89*          (2020.01)
(52) U.S. Cl.
CPC ........ *H10F 39/8027* (2025.01); *G01S 7/4816*
(2013.01); *G01S 17/89* (2013.01); *H10F*
*39/807* (2025.01)
(58) Field of Classification Search
CPC .... H10F 39/8027; H10F 39/807; H10F 39/80;
H10F 39/8033; G01S 7/4816; G01S
17/89; G01S 17/894; G01J 1/42
See application file for complete search history.

(56) References Cited

U.S. PATENT DOCUMENTS

| | | | |
|---|---|---|---|
| 7,148,528 B2 | 12/2006 | Rhodes | |
| 12,015,862 B2 * | 6/2024 | Ma et al. ............ | H10F 39/8037 |
| 2006/0255372 A1 * | 11/2006 | Patrick et al. ...... | H10F 39/1865 |
| | | | 257/225 |
| 2018/0188356 A1 | 7/2018 | Na et al. | |
| 2019/0312158 A1 | 10/2019 | Chen et al. | |
| 2020/0382736 A1 * | 12/2020 | Na ........................ | H04N 25/705 |
| 2021/0066529 A1 | 3/2021 | Lu et al. | |

FOREIGN PATENT DOCUMENTS

TW          201911592 A      3/2019

OTHER PUBLICATIONS

EP Extended Search Report in European Appln. No. 22163796.0,
dated Sep. 12, 2022, 8 pages.

* cited by examiner

*Primary Examiner* — Christine S. Kim
*Assistant Examiner* — Nathalie R Fayette
(74) *Attorney, Agent, or Firm* — Fish & Richardson P.C.

(57) ABSTRACT

Methods, devices, apparatus, and systems for photo-detect-
ing are provided. In one aspect, a photo-detecting apparatus
includes: a pixel having an absorption region configured to
receive an optical signal and to generate photo-carriers in
response to the optical signal, a substrate supporting the
absorption region, and at least one additional region formed
in the substrate. The absorption region includes a first
material, the substrate includes a second material different
from the first material. The at least one additional region
includes a third material different from the second material.
A total area of the absorption region and the at least one
additional region is at least 20% of an area of the pixel.

20 Claims, 26 Drawing Sheets

A - A'

A - A'

400

A - A'

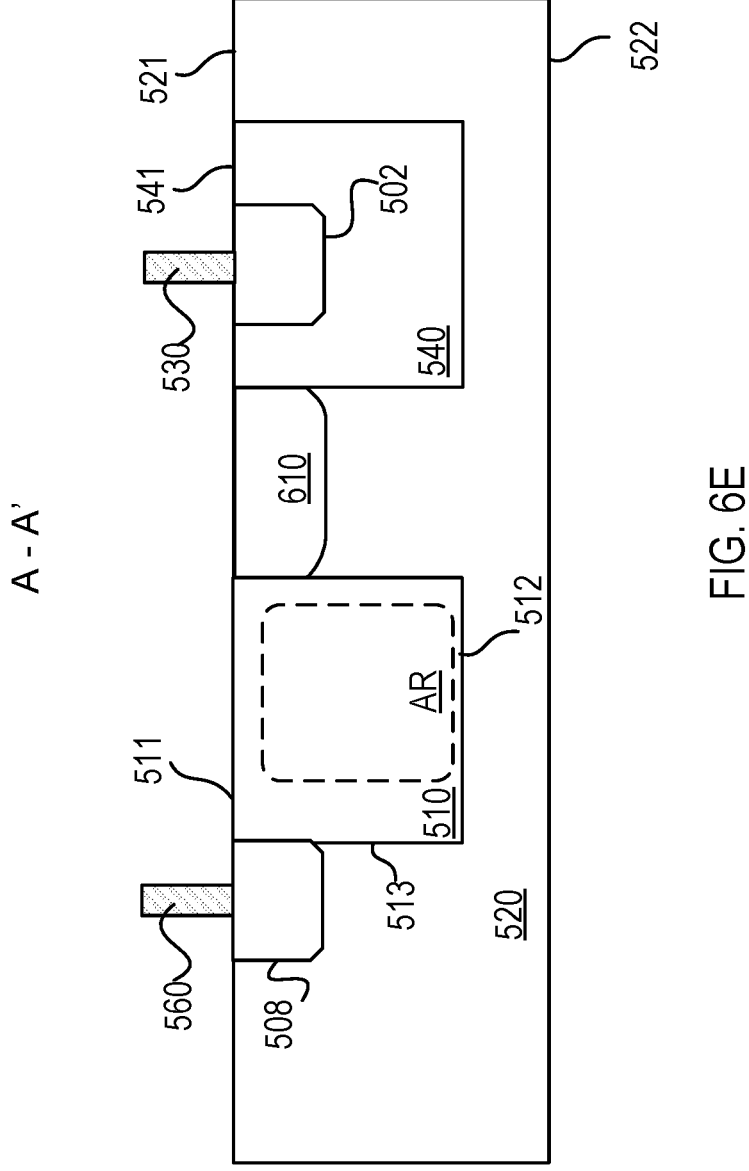
A - A'
FIG. 6E
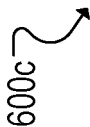

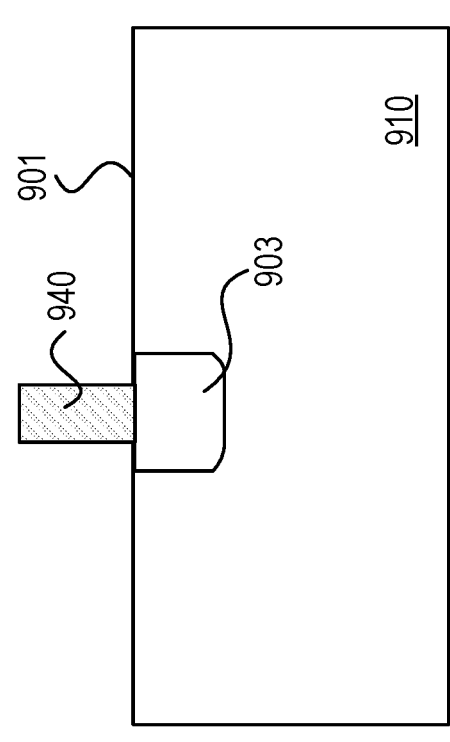
FIG. 9A
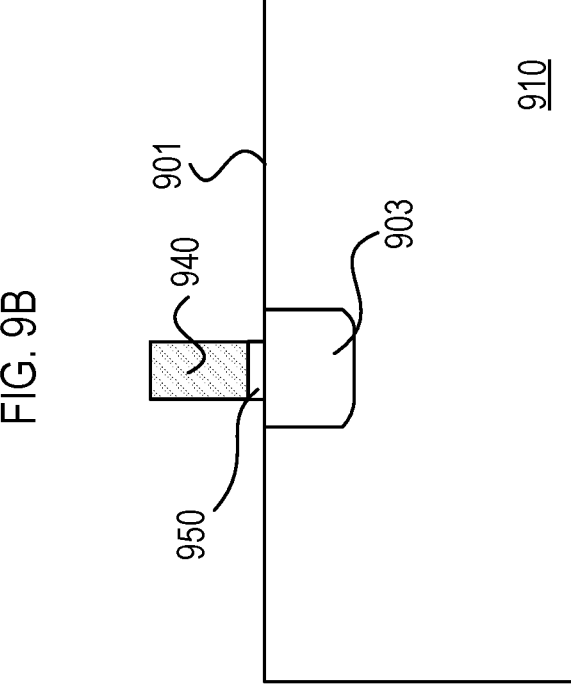
FIG. 9B
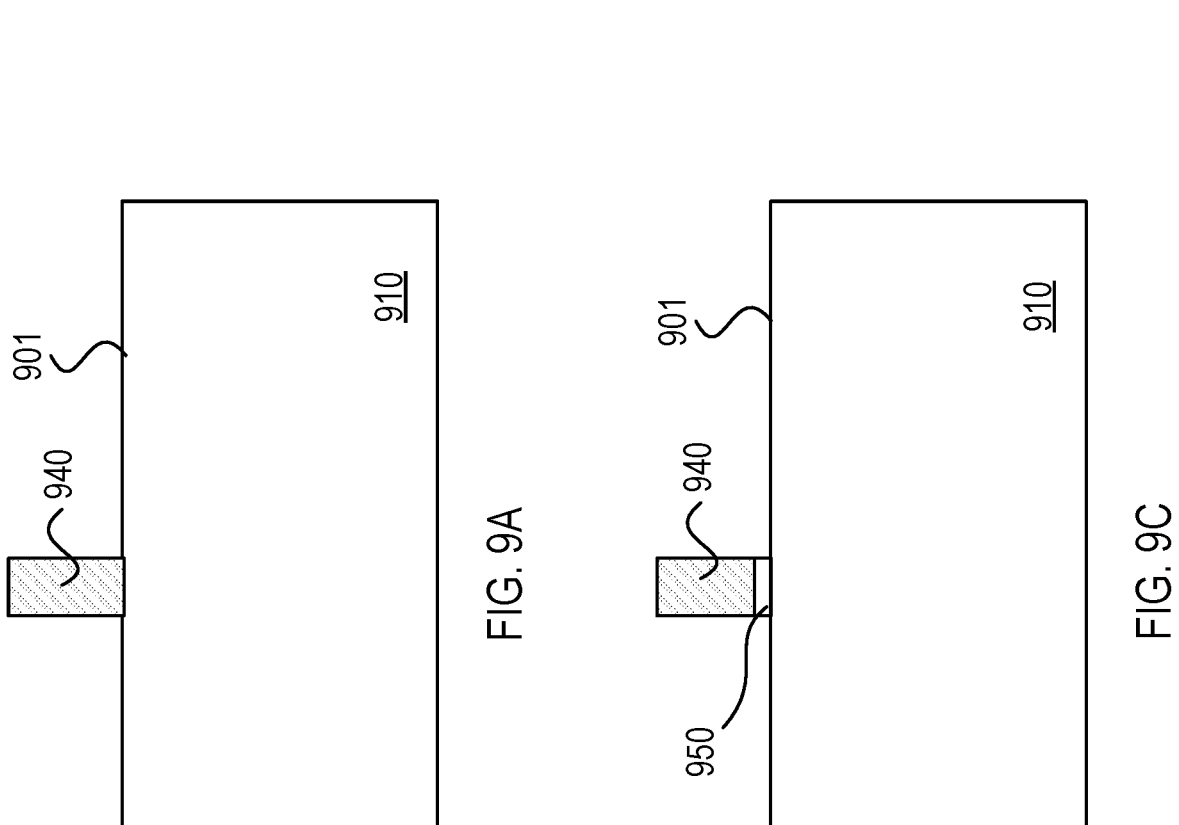
FIG. 9C
FIG. 9D

PHOTO-DETECTING APPARATUS

CROSS-REFERENCE TO RELATED APPLICATIONS

This application claims priority under 35 USC § 119(e) to U.S. Provisional Patent Application Ser. No. 63/165,203, entitled "PHOTO-DETECTING APPARATUS" and filed on Mar. 24, 2021, and U.S. Provisional Patent Application Ser. No. 63/221,945, entitled "PHOTO-DETECTING APPARATUS WITH LOW DARK CURRENT" and filed on Jul. 15, 2021, the entire contents of which are hereby incorporated by reference.

BACKGROUND

Photodetectors may be used to detect optical signals and convert the optical signals to electrical signals that may be further processed by another circuitry. Photodetectors may be used in consumer electronics products, proximity sensing, biometric sensing, image sensors, high-speed optical receiver, data communications, direct/indirect time-of-flight (TOF) ranging or imaging sensors, medical devices, and many other suitable applications.

SUMMARY

The present disclosure describes systems, devices, apparatus, methods, and techniques for photo detecting.

One aspect of the present disclosure features a photo-detecting apparatus including a pixel having an absorption region configured to receive an optical signal and to generate photo-carriers in response to the optical signal, where the absorption region includes a first material. The photo-detecting apparatus further includes a substrate supported the absorption region, where the substrate includes a second material different from the first material. The photo-detecting apparatus further includes an additional region formed in the substrate, where the additional region includes a third material different from the second material. A total area of the absorption region and the additional region is at least 20% of an area of the pixel.

Another aspect of the present disclosure features a photo-detecting apparatus including a pixel having an absorption region configured to receive an optical signal and to generate photo-carriers in response to the optical signal, where the absorption region includes a first material. The photo-detecting apparatus further includes a substrate supported the absorption region, where the substrate includes a second material different from the first material. The photo-detecting apparatus further includes an additional region formed in the substrate, where the additional region includes a third material different from the second material. The photo-detecting apparatus further includes a light shield including an optical window corresponding to the absorption region. The light shield blocks the optical signal from entering the additional region.

In some embodiments, the photo-detecting apparatus further includes an isolation region formed in the substrate.

In some embodiments, the isolation region surrounds the absorption region, and the isolation region is between the absorption region and the additional region.

In some embodiments, the isolation region surrounds the absorption region and the additional region.

In some embodiments, the first material and the third material are the same.

In some embodiments, the third material includes a metal.

In some embodiments, the third material includes an insulating material.

In some embodiments, each pixel includes two switches electrically coupled to a respective absorption region.

In some embodiments, the absorption region is doped with a first dopant having a first conductivity type.

In some embodiments, the additional region is doped with the first conductivity type.

In some embodiments, the photo-detecting apparatus further includes a blocking layer surrounding the additional region.

In some embodiments, the photo-detecting apparatus further includes a low-barrier region in contact with the absorption region and separated from the additional region.

In some embodiments, the photo-detecting apparatus further include multiple switches electrically coupled to the absorption region. Each of the multiple switches includes a readout electrode. The multiple readout electrodes are disposed at a same side of the absorption region.

Another aspect of the present disclosure features a photo-detecting apparatus including a pixel having an absorption region configured to receive an optical signal and to generate photo-carriers in response to the optical signal, where the absorption region includes a first material. The photo-detecting apparatus further includes a substrate supported the absorption region, where the substrate includes a second material different from the first material. The photo-detecting apparatus further includes an additional region formed in the substrate, where the additional region includes a third material different from the second material. The photo-detecting apparatus further includes a low-barrier region formed in the substrate and in contact with the absorption region and separated from the additional region.

In some embodiments, the absorption region is doped with a first dopant having a first conductivity type. The low-barrier region is doped with another dopant having a second conductivity type different from the first conductivity type.

Another aspect of the present disclosure features a photo-detecting apparatus including two adjacent pixels each having an absorption region configured to receive an optical signal and to generate photo-carriers in response to the optical signal, where the absorption region includes a first material. The photo-detecting apparatus further includes a substrate supporting the two adjacent pixels, where the substrate includes a second material different from the first material. The photo-detecting apparatus further includes an additional region between the absorption regions of the two adjacent pixels, wherein the additional region includes a third material different from the second material. The photo-detecting apparatus further includes two isolation regions each surrounding a respective absorption region of the absorption regions of the two adjacent pixels.

In some embodiments, for each of the two adjacent pixels, a total area of the absorption region and the additional region is at least 20% of an area of the pixel.

In some embodiments, the first material and the third material are the same.

In some embodiments, the third material includes a metal.

In some embodiments, the third material includes an insulating material.

In some embodiments, one of the isolation regions surrounds the additional region and the respective absorption region.

Another aspect of the present disclosure features an imaging system, including: a transmitter; a receiver; a signal processor in electrical communication with the receiver; and a controller in electrical communication with the signal processor and the transmitter. The receiver includes one or more photo-detecting apparatus. Each of the one or more photo-detecting apparatus includes: a pixel including an absorption region configured to receive an optical signal and to generate photo-carriers in response to the optical signal, a substrate supporting the absorption region, and an additional region formed in the substrate. The absorption region includes a first material, the substrate includes a second material different from the first material, and the additional region includes a third material different from the second material. A total area of the absorption region and the additional region is at least 20% of an area of the pixel.

In some embodiments, the imaging system further includes an isolation region formed in the substrate. The isolation region can surround the absorption region, and the isolation region can be between the absorption region and the additional region.

In some embodiments, the isolation region surrounds the absorption region and the additional region.

In some embodiments, the first material and the third material are same.

In some embodiments, the absorption region is doped with a first dopant having a first conductivity type.

In some embodiments, the additional region is doped with the first conductivity type.

Another aspect of the present disclosure features a photo-detecting apparatus, including: a substrate including a first material; an absorption region supported by the substrate and configured to receive an optical signal and to generate photo-carriers in response to the optical signal; a density-compensation region supported by the substrate and separated from the absorption region; and a first electrode formed over a first surface of the density-compensation region and electrically coupled to the density-compensation region and the absorption region to collect a first portion of the photo-carriers generated by the absorption region. The absorption region includes a second material different from the first material, and where the absorption region is doped with a first dopant having a first conductivity type. The density-compensation region includes the second material, and where the density-compensation region is doped with a second dopant having a second conductivity type that is opposite from the first conductivity type.

In some embodiments, the photo-detecting apparatus further includes: a second electrode formed over one of a first surface of the substrate or a first surface of the absorption region and electrically coupled to the absorption region. The second electrode is configured to collect a second portion of the photo-carriers generated by the absorption region. In some embodiments, the first portion of the photo-carriers has a different polarity from the second portion of the photo-carriers.

In some embodiments, the absorption region has a first peak doping concentration, the substrate includes a low-barrier region, and the substrate or the low-barrier region of the substrate in contact with the absorption region is doped with a third dopant having the second conductivity type and a second peak doping concentration. In some embodiments, a ratio between the first peak doping concentration of the absorption region and the second peak doping concentration of the substrate or the low-barrier region is equal to or greater than 10. In some embodiments, at least a part of the low-barrier region is arranged between the absorption region and the density-compensation region. In some embodiments, a third peak doping concentration of the density-compensation region is higher than the second peak doping concentration of the substrate or the low-barrier region.

In some embodiments, at least a part of the absorption region or at least a part of the density-compensation region is embedded in the substrate.

In some embodiments, the substrate is composed of silicon, the absorption region is composed of germanium, and the density-compensation region is composed of germanium.

In some embodiments, the substrate further includes a high-barrier region in contact with the absorption region, and the high-barrier region is doped with a fourth dopant of the first conductivity type.

Another aspect of the present disclosure features a photo-detecting apparatus, including: a substrate including a first material; an absorption region supported by the substrate and configured to receive an optical signal and to generate photo-carriers in response to the optical signal; one or more density-compensation regions supported by the substrate and separated from the absorption region; and one or more switches electrically coupled to the absorption region and partially formed in the substrate. The absorption region includes a second material different from the first material, and the absorption region is doped with a first dopant having a first conductivity type. The one or more density-compensation regions includes the second material, and the one or more density-compensation regions are doped with a second dopant having a second conductivity type that is opposite from the first conductivity type. Each of the one or more switches includes a respective control electrode and a respective readout electrode, where the respective readout electrode is formed over a first surface of a corresponding density-compensation region of the one or more density-compensation regions, and the respective readout electrode is configured to collect a first portion of the photo-carriers generated by the absorption region.

In some embodiments, each of the one or more control electrodes is formed over a first surface of the substrate and are separated from the absorption region.

In some embodiments, the absorption region has a first peak doping concentration, the substrate includes one or more low-barrier regions, and the substrate or the one or more low-barrier regions of the substrate in contact with the absorption region is doped with a third dopant having the second conductivity type and a second peak doping concentration. In some embodiments, a ratio between the first peak doping concentration of the absorption region and the second peak doping concentration of the substrate or the one or more low-barrier regions is equal to or greater than 10. In some embodiments, at least a part of the one or more low-barrier regions is arranged between the absorption region and the one or more density-compensation regions. In some embodiments, a third peak doping concentration of the one or more density-compensation regions is higher than the second peak doping concentration of the substrate or the one or more low-barrier regions.

In some embodiments, at least a part of the absorption region or at least a part of the one or more density-compensation regions are embedded in the substrate.

In some embodiments, the substrate is composed of silicon, the absorption region is composed of germanium, and the one or more density-compensation regions are composed of germanium.

In some embodiments, the substrate further includes a high-barrier region in contact with the absorption region, and the high-barrier region is doped with a fourth dopant of the first conductivity type.

In some embodiments, the one or more readout electrodes and the one or more control electrodes are disposed at a same side of the absorption region.

Another aspect of the present disclosure features an imaging system, including: a transmitter; a receiver; a signal processor in electrical communication with the receiver; and a controller in electrical communication with the signal processor and the transmitter. The receiver includes any one or more photo-detecting apparatus described in the present disclosure.

The details of one or more disclosed implementations are set forth in the accompanying drawings and the description below. Other features, aspects, and advantages will become apparent from the description, the drawings and the claims.

BRIEF DESCRIPTION OF THE DRAWINGS

The foregoing aspects and many of the advantages of this application will become more readily appreciated as the same becomes better understood by reference to the following detailed description, when taken in conjunction with the accompanying drawings:

FIG. 6E illustrates a cross-sectional view of the photo-detecting apparatus along an A-A' line in FIG. 6D, according to one or more embodiments of the present disclosure.

FIGS. 9A-9D show examples of control regions of a photo-detecting apparatus, according to one or more embodiments of the present disclosure.

Like reference numbers and designations in the various drawings indicate like elements.

DETAILED DESCRIPTION

Figure 1A:
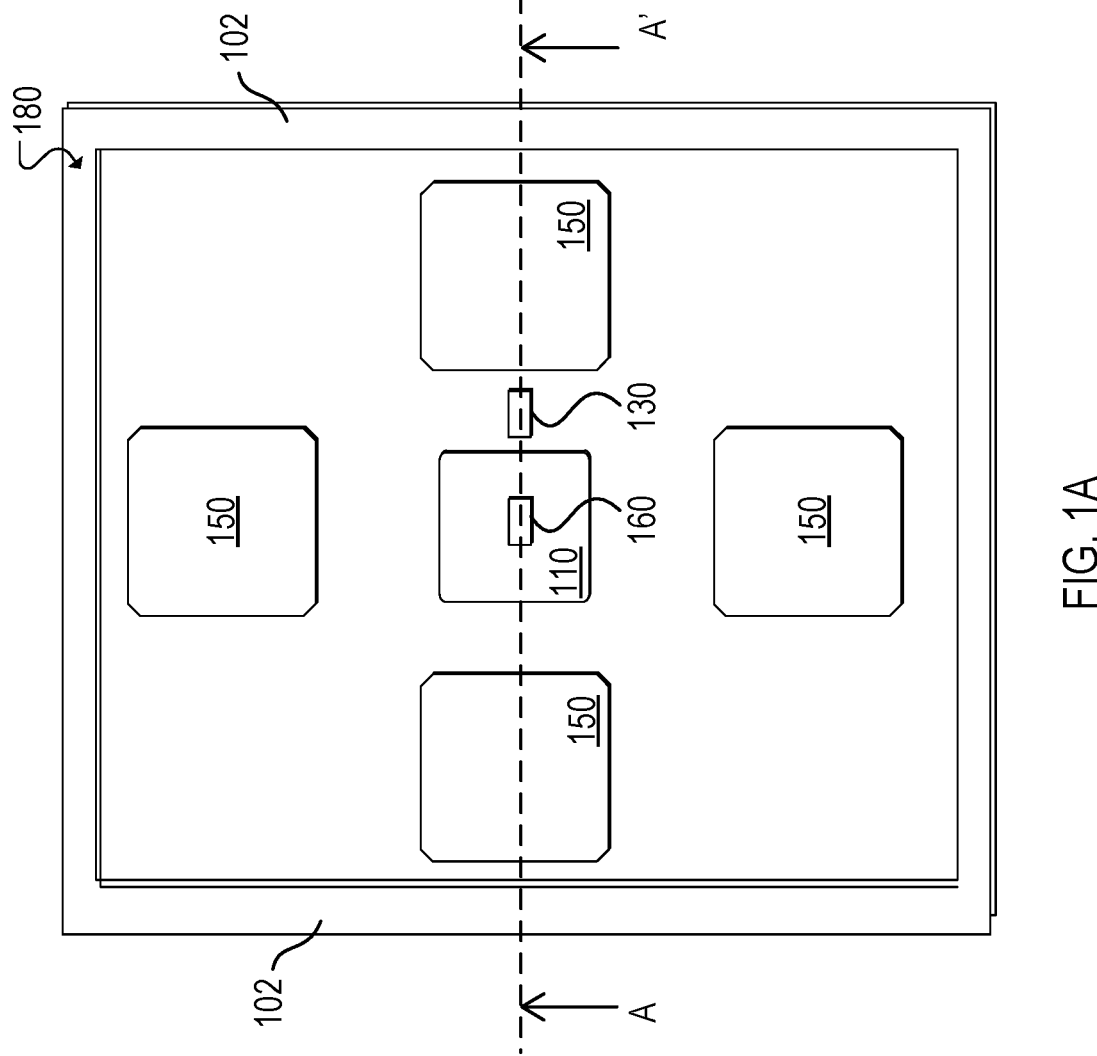
FIG. 1A illustrates a top view of an example of a photo-detecting apparatus, according to one or more embodiments of the present disclosure.
Figure 1A:
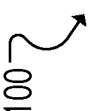
Figure 1B:
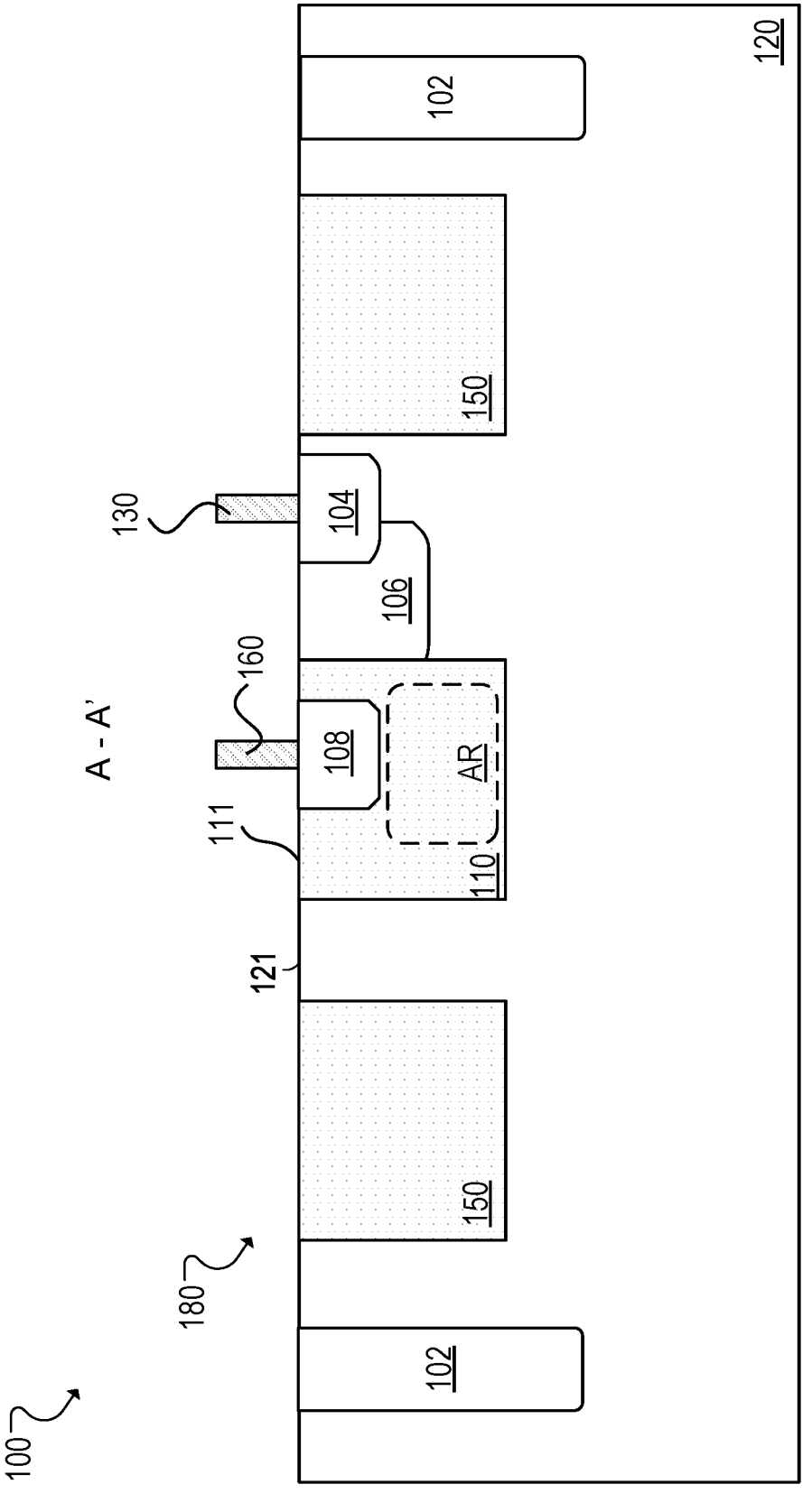
FIG. 1B illustrates a cross-sectional view along an A-A' line in FIG. 1A, according to one or more embodiments of the present disclosure.

FIG. 1A illustrates a top view of an example of a photo-detecting apparatus 100, according to one or more embodiments of the present disclosure. FIG. 1B illustrates a cross-sectional view of the photo-detecting apparatus 100 along an A-A' line in FIG. 1A, according to one or more embodiments of the present disclosure.

As illustrated in FIG. 1B, the photo-detecting apparatus 100 includes one or more pixels 180 each including an absorption region 110. The photo-detecting apparatus 100 further includes a substrate 120 that supports the absorption region 110. In some embodiments, the substrate 120 includes one or more trench or recess where at least a part of the absorption region 110 formed in. The absorption region 110 is configured to receive an optical signal and to generate photo-carriers in response to the optical signal. In some embodiments, an output electrical signal is determined by the photo-carriers generated from the absorption region 110. The substrate 120 includes a first material (e.g., silicon), and the absorption region 110 includes a second material (e.g., germanium) different from the first material. In some embodiments, the absorption region 110 is doped with a first dopant (e.g., boron) having a first conductivity type (e.g., p-type). In some embodiments, the substrate 120 is composed of silicon, the absorption region 110 is composed of germanium.

In some embodiments, each of the one or more pixels 180 includes one or more additional regions 150 (referred to generally as additional regions 150 and individually as additional region 150) supported by the substrate 120 and separated from the absorption region 110. In some embodiments, the one or more additional regions 150s are at least partially formed in the one or more trench or recess of the substrate 120 respectively. For example, as illustrated in FIG. 1A, the photo-detecting apparatus 100 includes four additional regions 150 arranged on four sides of the absorption region 110. The shape, size and placement of the additional region 150 is not limited to the drawn examples. For example, the additional region 150 may have a ring shape enclosing the absorption region 110. The number of the additional regions can be 2N, where N is a positive integer, such as, but not limited to 1 or 2.

In some embodiments, a total area of the absorption region 110 and the additional regions 150 is at least 20% (e.g., 25~40%) of an area of the pixel 180. In some embodiments, a distance of two adjacent pixels 180 is determined between two adjacent absorption regions 110. In some embodiments, a distance of two adjacent pixels 180 is determined between the centers of the two adjacent absorption regions 110.

In some embodiments, a depth of the additional region 150 may be the same or different from the depth of the absorption region 110.

In some embodiments, the additional region 150 includes a third material different from the first material of the substrate 120, e.g., $SiO_x$, $SiO_xN_y$, InGaAsP. In some examples, the third material includes a metal, e.g., Al or Cu, such that the additional region 150 can limit scattering light within photo-detecting apparatus 100. In some examples, the third material includes an insulating material. In some examples, the third material is same as the second material, e.g., pure germanium or $Si_xGe_{1-x}$. In some embodiments, the additional region 150 may include composite layers, such as, but is not limited, two or three layers with different materials. For example, the additional region 150 may be deposited by a layer of $SiO_2$, an adhesion layer of TiNx, and then fill the rest of trench of metal.

In some embodiments, the additional region 150 can also absorb scattered light and the photo-carriers not collected by the electrode (e.g., first electrode 130) can recombine within the additional region 150 instead of creating electrical noise in a substrate without the additional region 150. For example, long wavelength light such as, but not limited to, a peak wavelength greater than 800 nm, may not be absorbed by the second material of the substrate 120 if the second material is Si. As a result, if the third material of the additional region 350 is different from the second material, e.g., germanium, the additional region 100 can absorb scattered light and thus be used to reduce optical cross-talk. In some embodiments, an additional doped region may be placed within the additional region 150 or additional electrodes may be placed over the additional region 150. In some embodiments, the additional region 150 may include a photodiode or function for calibration purpose.

In some embodiments, at least one of the additional regions 150 is a density compensation region, e.g., to increase the density of the material that is different from the material of the substrate 120 in a same pixel so as to improve the quality of the absorption region 110. In other words, the additional regions 150 can achieve a more desirable distribution (e.g., more uniform pattern density, higher overall density, center/edge compensation, etc.) of the material different from the material of the substrate formed in the trench or recess of the substrate or formed on the substrate in order to improve device yield across a wafer. In some embodiments, when the third material is same as the second material, the additional regions 150 can achieve a more desirable distribution (e.g., more uniform pattern density, higher overall density, center/edge compensation, etc.) of the light absorption material deposited on the substrate or in the trench or recess of the substrate in order to improve device yield across a wafer.

The additional regions 150 may improve the growth quality of the absorption region 110, and thus improves pixel performance and process yield. In some embodiments, the additional regions 150 may be an isolation to lower or prevent signal cross-talk between the adjacent pixels 180.

In some embodiments, the absorption region 110 includes an optical signal receiving region AR, which is defined by a light shield (not shown) including an optical window. The optical signal receiving region (AR) is an area receiving an optical signal incoming through the optical window. In some embodiments, the optical signal incident from the light shield side is blocked by the light shield and may not enter the additional regions 150 in a predetermined way.

In some embodiments, the photo-detecting apparatus 100 includes a first doped region 104 formed in the substrate 120 and separated from the absorption region 110. In some embodiments, the first doped region 104 is separated from the additional regions 150. The first doped region 104 can be doped with a second dopant (e.g., phosphorus) having a second conductivity type (e.g., n-type) that is opposite from the first conductivity type (e.g., p-type).

In some embodiments, the absorption region 110 is doped with the first dopant having the first conductive type (e.g., p-type) and a first peak doping concentration. In some embodiments, at least a part of the substrate 120 (e.g., low-barrier region 106 as discussed with further details below or the entire substrate 120 is substantially doped with a third dopant (e.g., phosphorus) having the second conductivity type (e.g., n-type) and a second peak doping concentration. A ratio between the first peak doping concentration and the second peak doping concentration can be equal to or greater than a threshold ratio (e.g., 10) for lowering the dark current of the photo-detecting apparatus 100. In some embodiments, the first peak doping concentration can range from $1 \times 10^{16}$ cm$^{-3}$ to $1 \times 10^{20}$ cm$^{-3}$. The second peak doping concentration can range from $1 \times 10^{15}$ cm$^{-3}$ to $1 \times 10^{17}$ cm$^{-3}$. In some embodiments, the additional region 150 can be doped with a dopant having the first conductivity type (e.g., p-type), same as that of the absorption region 110. In some embodiments, a peak doping concentration of the dopant of the additional region 150 can range from $1 \times 10^{16}$ cm$^{-3}$ to $1 \times 10^{19}$ cm$^{-3}$, which increases recombination rate of carriers in the additional region 150 and thus lower the dark current of the photo-detecting apparatus 100.

The photo-detecting apparatus 100 can further include a first electrode 130 that is formed over the first doped region 104 and electrically coupled to the first doped region 104 and the absorption region 110 to collect a first portion of the photo-carriers of a first type (e.g., electrons) generated by the absorption region 110.

In some embodiments, the photo-detecting apparatus 100 includes a second doped region 108 formed in the absorption region 110 and near a first surface 111 of the absorption region 110. The second doped region 108 can be doped with the first conductivity type (e.g., p-type). In some embodiments, the second doped region 108 is doped with a dopant (e.g., boron) having a peak doping concentration higher than the first peak doping concentration of the absorption region 110.

In some embodiments, the photo-detecting apparatus 100 further includes a second electrode 160 that can be formed over the second doped region 108 and electrically coupled to the absorption region 110. The second electrode 160 is configured to collect a second portion of the photo-carriers (e.g., holes) generated by the absorption region 110.

In some embodiments, the first portion of the photo-carriers collected by the first electrode 130, e.g., electrons, is different from the second portion of the photo-carriers collected by the second electrode 160, e.g., holes. The collected photo-carriers can be processed by separate circuitry (e.g., readout circuitry such as a readout circuit 1054 in FIG. 10B).

In some embodiments, the photo-detecting apparatus 100 includes a low-barrier region 106 formed in the substrate 120. The low-barrier region 106 can be in contact with the absorption region 110. In some embodiments, at least a part of the low-barrier region 106 is between the absorption region 110 and the first doped region 104. In some embodiments, the low-barrier region 106 is separated from the additional region 150. In some embodiments, the low-barrier region 106 is doped with the third dopant (e.g., phosphorus) having the second conductivity type (e.g., n-type) and the second peak doping concentration. The low-barrier region 106 can be configured to guide the first portion of the photo-carriers (e.g., electrons) generated by the absorption region 110 in a confined region, such that the first portion of the photo-carriers (e.g., electrons) can flow from the absorption region 110 towards the first doped region 104 via the low-barrier region 106 and then be collected by the first electrode 130.

In some embodiments, the first doped region 104 is doped with the second dopant having the second conductivity type (e.g., n-type) and a third peak doping concentration. The third peak doping concentration can be higher than the second peak doping concentration so as to attract the first portion of the photo-carriers (e.g., electrons) flow to the first doped region 104 and then be collected by the first electrode 130.

In some embodiments, as illustrated in FIGS. 1A and 1B, the photo-detecting apparatus 100 includes one or more isolation regions 102 (referred to generally as isolation regions 102 and individually as isolation region 102) formed in the substrate 120. In some embodiments, the isolation region 102 can be formed by implantation. In some embodiments, the isolation region 102 can be a doped region. In some embodiments, the isolation region 102 has the second conductive type, e.g., n-type.

In some embodiments, the isolation regions 102 includes a semiconductor material that is different from the second material of the substrate 120. An interface between two different semiconductor materials formed between the substrate 120 and the isolation regions 102 may create a bandgap offset-induced energy barrier that impedes a flow of current across the isolation regions 102 and improving electrical isolation between the adjacent pixels 180. In some embodiments, the shape of the isolation region 102 may be a ring or square surrounding the absorption region 110. In some embodiments, the isolation regions 102 may include two discrete regions disposed at the two opposite sides of the absorption region 110.

In some embodiments, the isolation regions 102 is a trench filled with a dielectric material or an insulating material to serve as a region of high electrical resistance between the two adjacent pixels 180, impeding a flow of current across the isolation region 102 and improving electrical isolation between the adjacent pixels 180. The dielectric material or an insulating material may include, but is not limited to oxide material including $SiO_2$ or nitride material including $Si_3N_4$ or silicon material including amorphous-Si, poly-Si, monocrystalline-Si, or epitaxial-Si. In some embodiments, the isolation regions 102 extends from a first surface (e.g., a top surface) 121 of the substrate 120 and extends into a predetermined depth from the first surface 121.

In some embodiments, as illustrated in FIGS. 1A and 1B, the isolation region 102 surrounds the absorption region 110 and the additional regions 150. In some embodiments, the isolation region 102 surrounds the absorption region 110, and the isolation region 102 can be between the absorption region 110 and the additional region 150.

In some embodiments, the isolation region 102 defines a boundary of the pixel 180. As illustrated in FIGS. 1A and 1B, the pixel 180 can include the isolation region 102, absorption region 110 and the additional regions 150. In some embodiments, the additional regions 150 can be another isolation structure besides the isolation region 102. As a result, the signal cross-talk between the adjacent pixels 180 can be further reduced by the combination of the additional regions 150 and the isolation region 102.

Figure 2A:
FIG. 2A illustrates a top view of an example of a photo-detecting apparatus, according to one or more embodiments of the present disclosure.
Figure 2B:
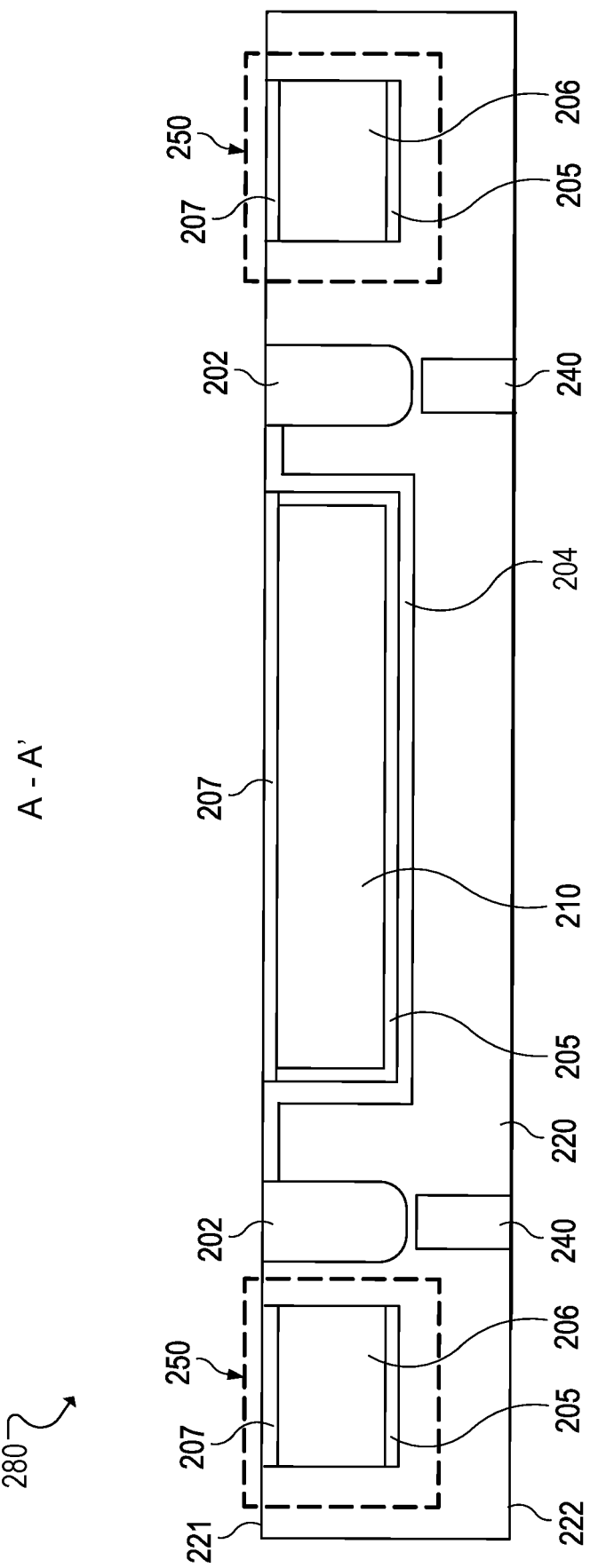
FIG. 2B illustrates a cross-sectional view of the photo-detecting apparatus along an A-A' line in FIG. 2A, according to one or more embodiments of the present disclosure.

FIG. 2A illustrates a top view of an example of a photo-detecting apparatus 200, according to one or more embodiments of the present disclosure. FIG. 2B illustrates a cross-sectional view of the photo-detecting apparatus 200 along an A-A' line in FIG. 2A, according to one or more embodiments of the present disclosure.

The photo-detecting apparatus 200 includes multiple pixels 280 separated from one another by one or more additional regions 250. The photo-detecting apparatus 200 includes a first isolation region 202 and/or an additional second isolation region 240 formed in a substrate 220 (e.g., the substrate 120 of FIGS. 1A-1B). As illustrated in FIG. 2B, the first isolation region 202 and the second isolation region 240 can be opposite to each other along a direction perpendicular to a first surface 221 or a second surface 222 of the substrate 220.

Each pixel 280 includes an absorption region 210. The absorption region 210 can be substantially same as the absorption region 110 of FIGS. 1A-1B or an absorption region 310 as discussed with further details in FIGS. 3A-3C. The absorption region 210 is supported by the substrate 220 and is surrounded by the first isolation region 202 and/or the second isolation region 240. The first isolation region 202 and/or the second isolation region 240 is physically separated from the absorption region 210. In some embodiments, a distance of two adjacent pixels 280 is determined between two adjacent absorption regions 210. In some embodiments, a distance of two adjacent pixels 280 is determined between the centers of the two adjacent absorption regions 210.

Different from the photo-detecting apparatus 100 of FIGS. 1A-1B where the additional regions 150 are surrounded by the isolation region 102, in the photo-detecting apparatus 200, the additional regions 250 are outside of the first isolation region 202 and/or the second isolation region 240. In some embodiments, as illustrated in FIGS. 2A-2B, each absorption region 210 is surrounded by four adjacent addition regions 250.

The material and the function of the first isolation region 202 and/or the second isolation region 240 is similar or the same as the isolation region 102 as mentioned above. In some embodiments, the second isolation region 240 can be formed by backside deep trench isolation (BDTI).

In some embodiments, the first isolation region 202 extends from the first surface (e.g., a top surface) 221 of the substrate 220 and extends into a predetermined depth from the first surface 221. In some embodiments, the second isolation region 240 extends from the second surface (e.g., a bottom surface) 222 of the substrate 220 opposite to the first surface 221 and extends into a predetermined depth from the second surface 222. In some embodiments, an isolation region penetrates through the substrate 220 from the first surface 221 to the second surface 222. That is, the first isolation region 202 and the second isolation region 240 may become an integrated isolation region.

In some embodiments, the photo-detecting apparatus 200 includes a blocking layer 204 surrounding at least a portion of the absorption region 210. In some embodiments, the blocking layer 204 has a conductivity type which is the same as the first conductivity type of the absorption region 210. The blocking layer 204 may block photo-generated charges in the absorption region 210 from reaching the substrate 220, which increases a collection efficiency of photo-generated carriers of the photo-detecting apparatus 200. The blocking layer 204 may also block photo-generated charges in the substrate 220 from reaching the absorption region 210, which increases the speed of photo-generated carriers of the photo-detecting apparatus 200.

The blocking layer 204 may include a material which is the same as the material of the absorption region 210, the material of the substrate 220, a material as a combination of the material of the absorption region 210 and the material of the substrate 220, or different from the material of the absorption region 210 and the material of the substrate 220. In some embodiments, a shape of the blocking layer 204 may be but not limited to a ring. In some embodiments, the blocking layer 204 can reach the first surface 221 of the substrate 220. In some embodiments, the blocking layer 204 includes a dopant and has a dopant profile with a peak dopant concentration ranging from $1 \times 10^{15}$ cm$^{-3}$ to $1 \times 10^{20}$ cm$^{-3}$. The blocking layer 204 may reduce the cross talk between two adjacent pixels 280.

In some embodiments, an interfacial layer 205 is deposited along a trench sidewall and a trench bottom of the substrate 220 and followed by a selective growth of the absorption region 210. In some embodiments, the additional region 250 may also include the interfacial layer 205. In some embodiments, the interfacial layer 205 may include single crystalline silicon for improving the growth quality of the layers grown thereon.

In some embodiments, the photo-detecting apparatus 200 further incudes a passivation layer 207 over a first surface of the absorption region 210. In some embodiments, the passivation layer 207 may further cover a portion of the first surface 221 of the substrate 220. In some embodiments, the absorption region 210 is at least partially protruded from the first surface 221 of the substrate 220, and the passivation layer 207 further covers a sidewall of the absorption region 210 exposed from the substrate 220. The passivation layer 207 may include amorphous silicon, poly silicon, epitaxial silicon, aluminum oxide (e.g., AlxOy), silicon oxide (e.g., SixOy), Ge oxide (e.g., GexOy), germanium-silicon (e.g., GeSi), silicon nitride family (e.g., SixNy), high-k materials (e.g., HfOx, ZnOx, LaOx, LaSiOx), and any combination thereof. The presence of the passivation layer 207 may have various effects. For example, the passivation layer 207 may act as a surface passivation layer to the absorption region 210, which may reduce dark current or leakage current generated by defects occurred at the exposed surface of the absorption region 210.

The additional region 250 can be substantially same as the additional region 150 of FIGS. 1A-1B.

In some embodiments, the additional region 250 may include a photodiode or function for calibration purpose to adjust the output electrical signal from the absorption region 110. That is, a part of the additional region 250 can be an additional absorption region 206 between an interfacial layer 205 and a passivation layer 207. In such embodiments, the light shield may also include an optical window corresponding the additional region 250.

Figure 2C:
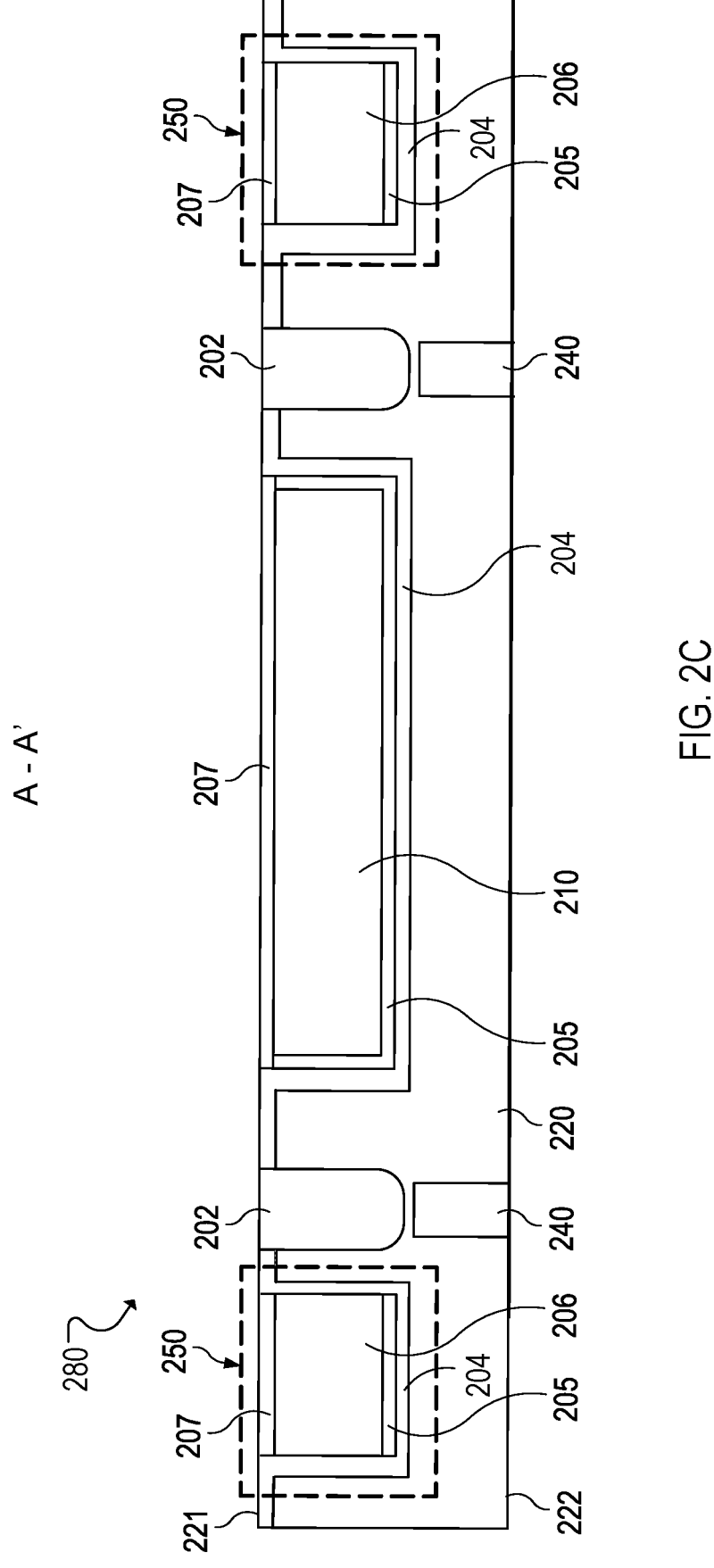
FIG. 2C illustrates a cross-sectional view of the photo-detecting apparatus along an A-A' line in FIG. 2A, according to one or more embodiments of the present disclosure.

FIG. 2C illustrates a cross-sectional view of the photo-detecting apparatus along an A-A' line in FIG. 2A, according to one or more embodiments of the present disclosure. In some embodiments, the photo-detecting apparatus 200 may include other blocking layers 204 each surrounding a corresponding additional region 150 for further lowering the dark current of the photo-detecting apparatus 200.

Figure 3A:
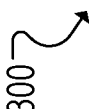
FIG. 3A illustrates a top view of an example of a photo-detecting apparatus, according to one or more embodiments of the present disclosure.
Figure 3B:
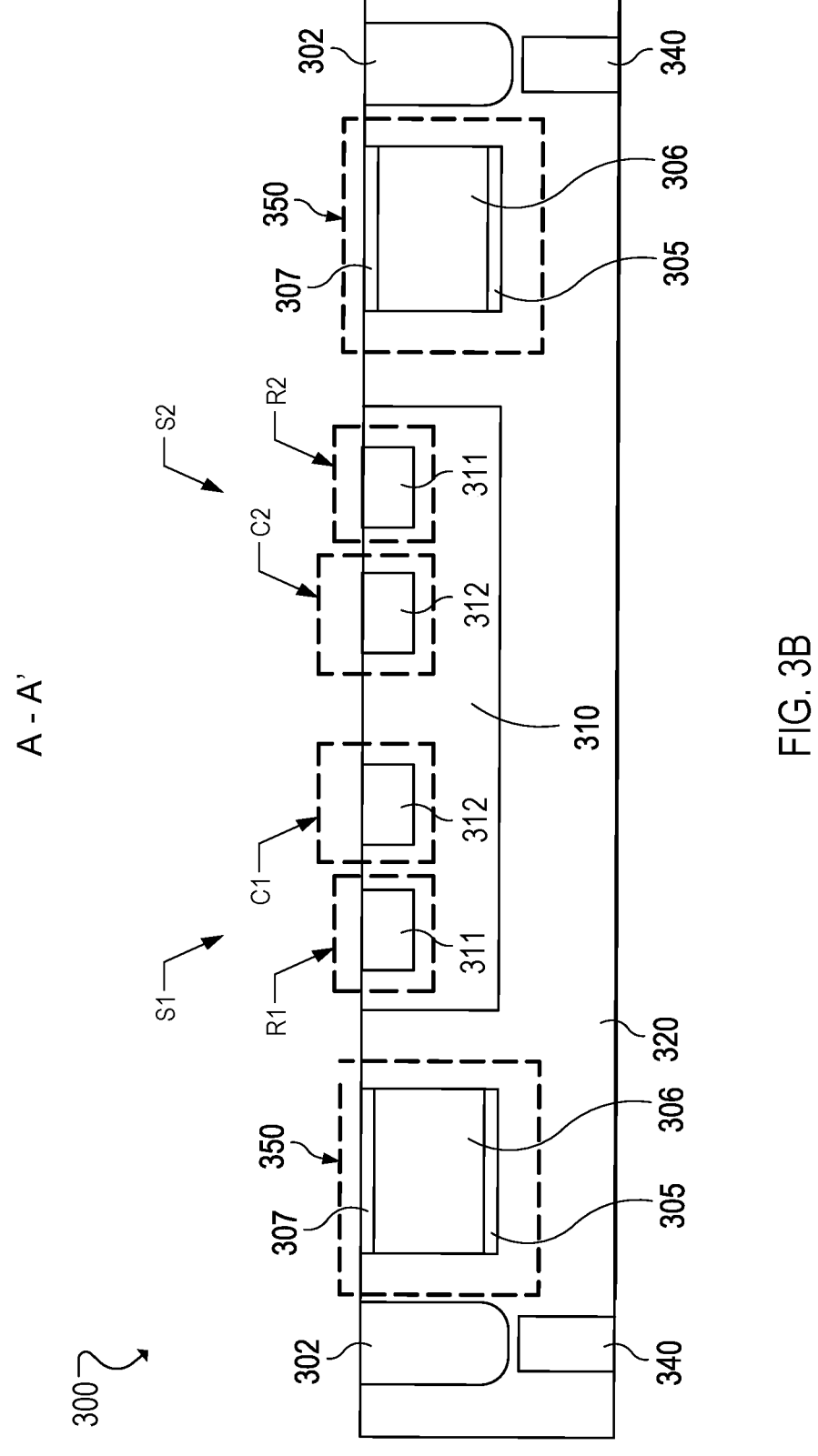
FIG. 3B illustrates a cross-sectional view of the photo-detecting apparatus along an A-A' line in FIG. 3A, according to one or more embodiments of the present disclosure.
Figure 3C:
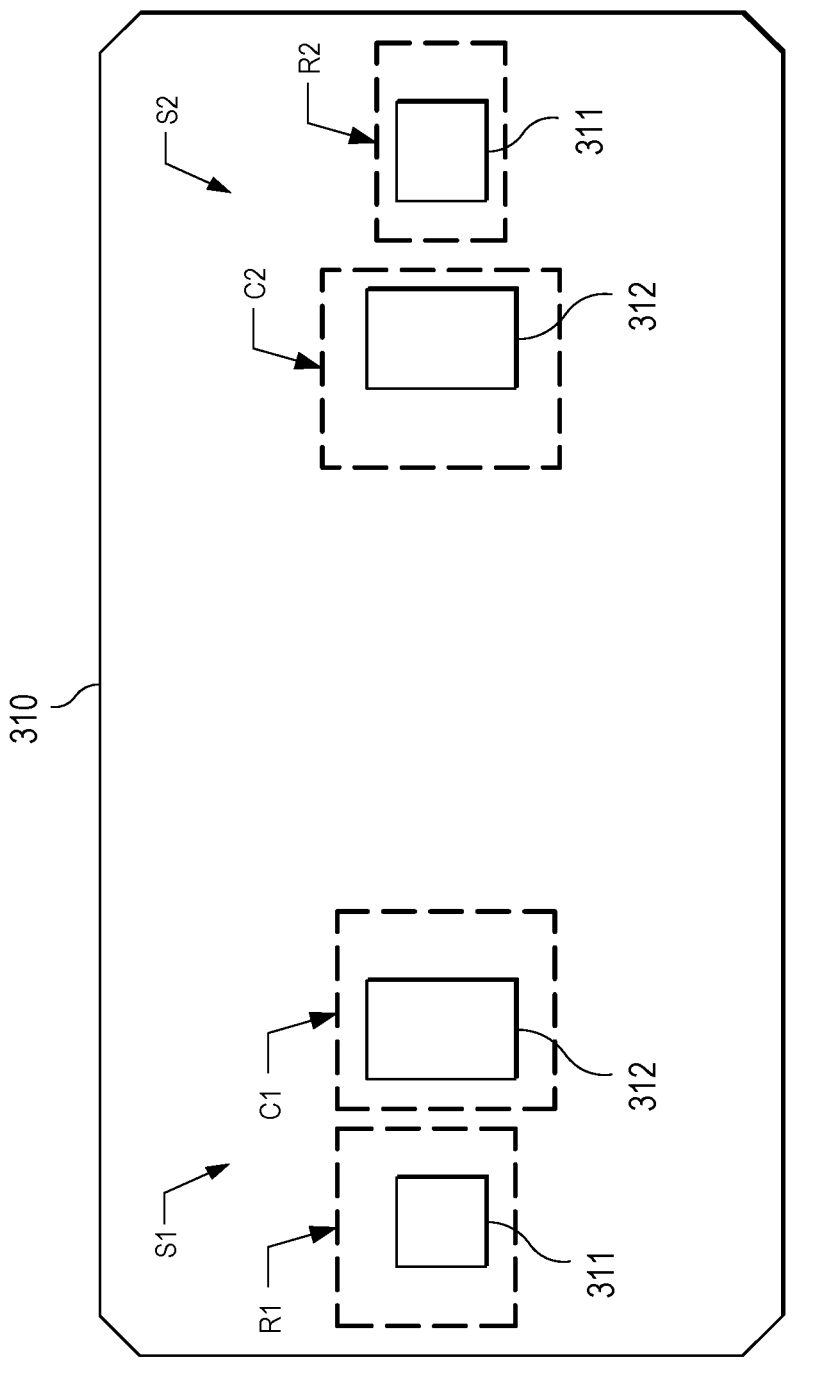
FIG. 3C illustrates another top view of the photo-detecting apparatus of FIG. 3A, according to one or more embodiments of the present disclosure.
Figure 3C:
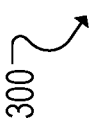

FIGS. 3A-3C illustrate an example photo-detecting apparatus 300. The photo-detecting apparatus 300 includes multiple pixels 380 arranged in an array.

Similar to the pixel 180 of FIGS. 1A-1B, the pixel 380 in the photo-detecting apparatus 300 includes an absorption region 310 and one or more additional regions 350 formed in a substrate 320 (e.g., 120 of FIG. 1B or 220 of FIG. 2B). A first isolation region 302 (e.g., 102 of FIGS. 1A-1B or 202 of FIGS. 2A-2B) and/or a second isolation region 340 (e.g., isolation region 240 of FIGS. 2A-2B) defines a boundary of the pixel 380.

Adjacent pixels 380 are separated or isolated from each other by the first isolation region 302 and/or the second isolation region 340. Different from the photo-detecting apparatus 200 where the additional regions 250 are outside of the first isolation region 202 and the second isolation region 240, in the photo-detecting apparatus 300, the additional regions 350 are surrounded by the first isolation region 302 and/or the second isolation region 340. As illustrated in FIGS. 3A-3B, the additional region 350 is between the absorption region 310 and the first isolation region 302 and/or second isolation region 340.

In some embodiments, each pixel 380 in the photo-detecting apparatus 300 includes two switches S1, S2 electrically coupled to the absorption region 310. The switches S1, S2 can be switches S1, S2 as discussed with further details in FIGS. 3C, 7A-7E. Each of the switches S1, S2 includes a respective control region C1, C2 and a respective readout region R1, R2. Each of the control regions C1, C2 is coupled to a respective control signal (e.g., a first control signal or a second control signal), and each of the readout regions R1, R2 is coupled to a readout circuit (e.g., 1054 in FIG. 10B, where the readout circuit 1054 may include a first sub-readout circuit and a second readout circuit coupled to the readout regions R1, R2 respectively).

In some embodiments, each of the readout regions R1, R2 includes a respective carrier-output region 311 of a conductivity type (e.g., n-type). In some embodiments, each of the control regions C1, C2 includes a respective carrier control region 312 of a conductivity type (e.g., p-type). In some embodiments, the carrier-output regions 311 and the carrier control regions 312 are formed in the absorption region 310. In some embodiments, the carrier-output regions 311 and the carrier control regions 312 are formed in the substrate 320. In some embodiments, each of the readout regions R1, R2 includes a readout electrode (e.g., 730a, 730b as discussed with further details in FIGS. 7A-7E) over the absorption region 310 or over the substrate 320, depending on the location of the carrier-output regions 311 and the carrier control regions 312. Each of the control regions C1, C2 includes a control electrode (e.g., 740a, 740b as discussed with further details in FIGS. 7A-7E) over the absorption region 310 or over the substrate 320, depending on the location of the carrier-output regions 311 and the carrier control regions 312.

In some embodiments, the first control signal and the second control signal, control the control regions C1, C2 of the two switches S1, S2 respectively for controlling the moving direction of the electrons or holes generated by the absorbed photons in the absorption region 310. In some embodiments, the first control signal is different from the second control signal. For example, when control signals are used to provide different voltages and thus generate bias voltage, an electric field is created between the two portions right under the control electrodes as well as in the absorption region 310 or the substrate 320, and photo-carriers in the absorption region 310 drift towards one of the portions right under the readout electrodes depending on the direction of the electric field. In some embodiments, the first control signal includes a first phase, and the second control signal includes second phase, and the first control phase is not overlapped with the second control phase. In some embodiments, the first control signal is fixed at a voltage value V, and the second control signal alternates between voltage values V±ΔV. In some embodiments, ΔV is generated by a varying voltage signal, e.g., a sinusoid signal, a clock signal, or a pulse signal operated between 0 V and 3 V. The direction of the bias value determines the drift direction of the carriers generated from the absorption region 310. The control signals are modulated signals.

In some embodiments, the first isolation region 302 and/or the second isolation region 340 is a doped region having a conductivity type that can be different from or same as the conductivity type of the carrier-output regions 311 in the readout region R1, R2. The material and the function of the first isolation region 302 and/or the second isolation region 340 is similar or the same as the isolation region 102 as mentioned above.

In some embodiments, carrier-output regions 311 and carrier control regions 312 are formed in the substrate 320 and located outside of the absorption region 310 for reducing dark current of the photo-detecting apparatus 300. In some embodiments, the carrier-output regions 311 and the carrier control regions 312 may or may not be placed in the additional region 350.

The material and/or the features of the additional regions 350 are similar or the same as described above. For example, each of the additional regions 350 may also include an additional absorption region 306 (e.g., 206 of FIG. 2B) between an interfacial layer 305 (e.g., 205 of FIG. 2B) and a passivation layer 307 (e.g., 207 of FIG. 2B) for calibration purpose.

Figure 4A:
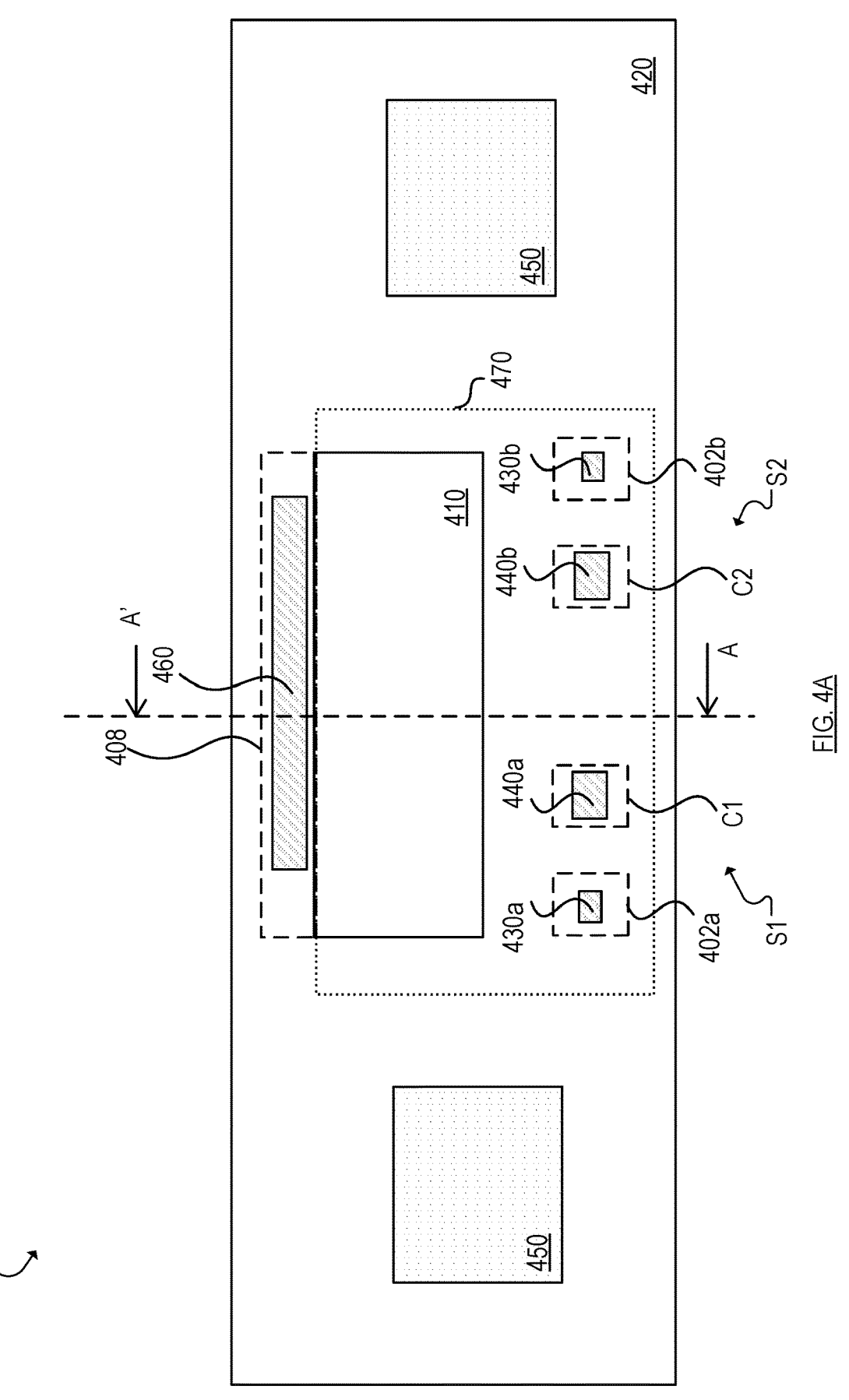
FIG. 4A illustrates a top view of a photo-detecting apparatus, according to one or more embodiments of the present disclosure.
Figure 4B:
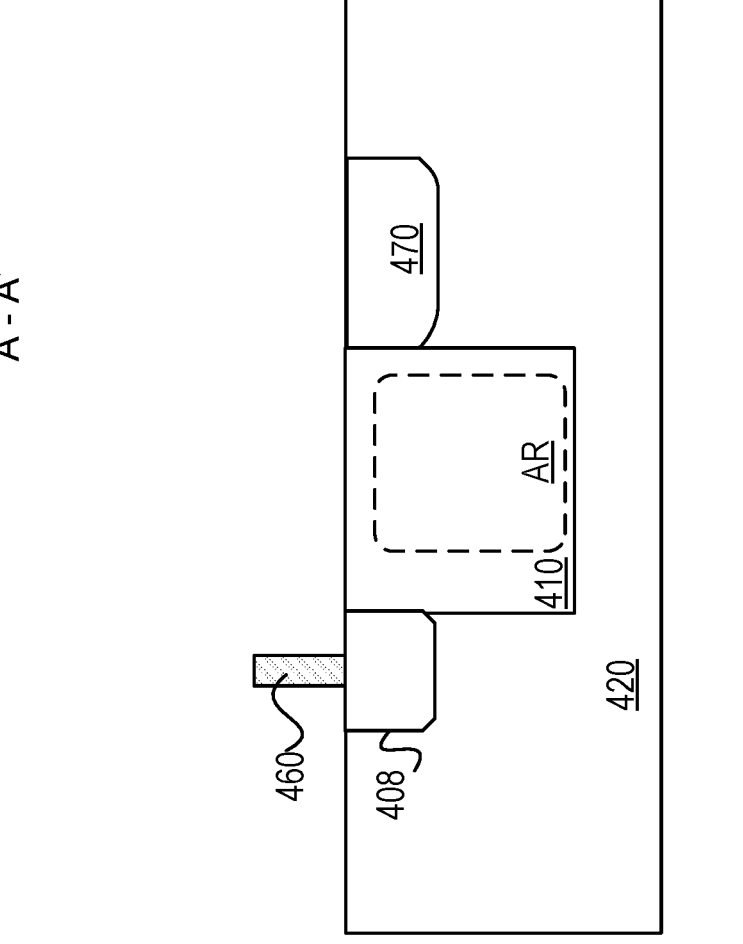
FIG. 4B illustrates a cross-sectional view of the photo-detecting apparatus along an A-A' line in FIG. 4A, according to one or more embodiments of the present disclosure.

FIG. 4A illustrates a top view of a photo-detecting apparatus 400, according to one or more embodiments of the present disclosure. FIG. 4B illustrates a cross-sectional view of the photo-detecting apparatus 400 along an A-A' line in FIG. 4A, according to one or more embodiments of the present disclosure.

The photo-detecting apparatus 400 includes an absorption region 410 supported by a substrate 420 and one or more additional regions 450 formed in or on the substrate 420. In some embodiments, as illustrated in FIG. 4A, the absorption region 410 is between the two additional regions 450 that are on opposite sides of the absorption region 410.

Like reference numbers and designations in in FIGS. 4A and 4B indicate like elements mentioned above. For example, the absorption region 410 can be similar to the absorption region 110 of FIGS. 1A-1B, 210 of FIGS. 2A-2B, or 310 of FIGS. 3A-3C. The substrate 420 can be similar to the substrate 120 of FIG. 1B, 220 of FIG. 2B, or 320 of FIG.

3B. The additional region 450 can be similar to the additional region 150 of FIGS. 1A-1B, 250 of FIGS. 2A-2B, or 350 of FIGS. 3A-3B.

In some embodiments, the photo-detecting apparatus 400 includes a doped region 408 formed in the substrate 420 and in contact with the absorption region 410. An electrode 460 can be formed over the first surface of the substrate 420. The doped region 408 can be doped with the first conductivity type (e.g., p-type) for collecting the second portion of the photo-carriers (e.g., holes) generated by the absorption region 410. In some embodiments, the doped region 408 is doped with a dopant (e.g., boron) having a peak doping concentration higher than the first peak doping concentration of the absorption region 410.

The photo-detecting apparatus 400 can be a dual-switch photo-detecting apparatus. As illustrated in FIG. 4A, the photo-detecting apparatus 400 includes two switches S1 and S2 electrically coupled to the absorption region 410 and partially formed in the substrate 420. The switches S1, S2 can be similar to the switches S1, S2 of FIGS. 3A-3C or S1, S2 as described with further details in FIGS. 7A-7D). The switches S1, S2 are on the same side of the absorption region 410.

Each of the two switches S1, S2 includes a readout electrode 430a, 430b and a control region C1, C2 having a control electrode 440a, 440b. Each readout electrode 430a, 430b can be formed over a first surface of the substrate 420 and electrically coupled to the absorption region 410 to collect a first portion of the photo-carriers (e.g., electrons) generated by the absorption region 410. In some embodiments, the control electrodes 440a, 440b are formed over the first surface of the substrate 420 and are separated from the absorption region 410.

In some embodiments, as illustrated in FIG. 4B, the photo-detecting apparatus 400 includes a low-barrier region 470 (e.g., a low-barrier region 610 as described with further details in FIGS. 6A-6E) in the substrate 420 in contact with the absorption region 410.

In some embodiments, as illustrated in FIG. 4A, the first switch S1 includes a carrier-output region 402a under the readout electrode 430a, and the second switch S2 includes a carrier-output region 402b under the readout electrode 430b. In some embodiments, the carrier-output regions 402a, 402b are of the second conductivity type (e.g., n-type). In some embodiments, the carrier-output regions 402a, 402b are doped with a dopant (e.g., phosphorus) and a peak doping concentration.

Since the doped region 408 is formed in the substrate 420 instead of in the absorption region 410, the electrode 460, the readout electrodes 430a, 430b, and the control electrodes 440a, 440b can all be coplanarly formed above the first surface of the substrate 420. Therefore, a height difference between any two of the electrode 460 and the readout electrodes 430a, 430b, and the control electrodes 440a, 440b can be reduced and thus the fabrication process afterwards will be benefit from this design. Besides, the area of the absorption region 410 absorbing the optical signal can be larger.

Figure 5A:
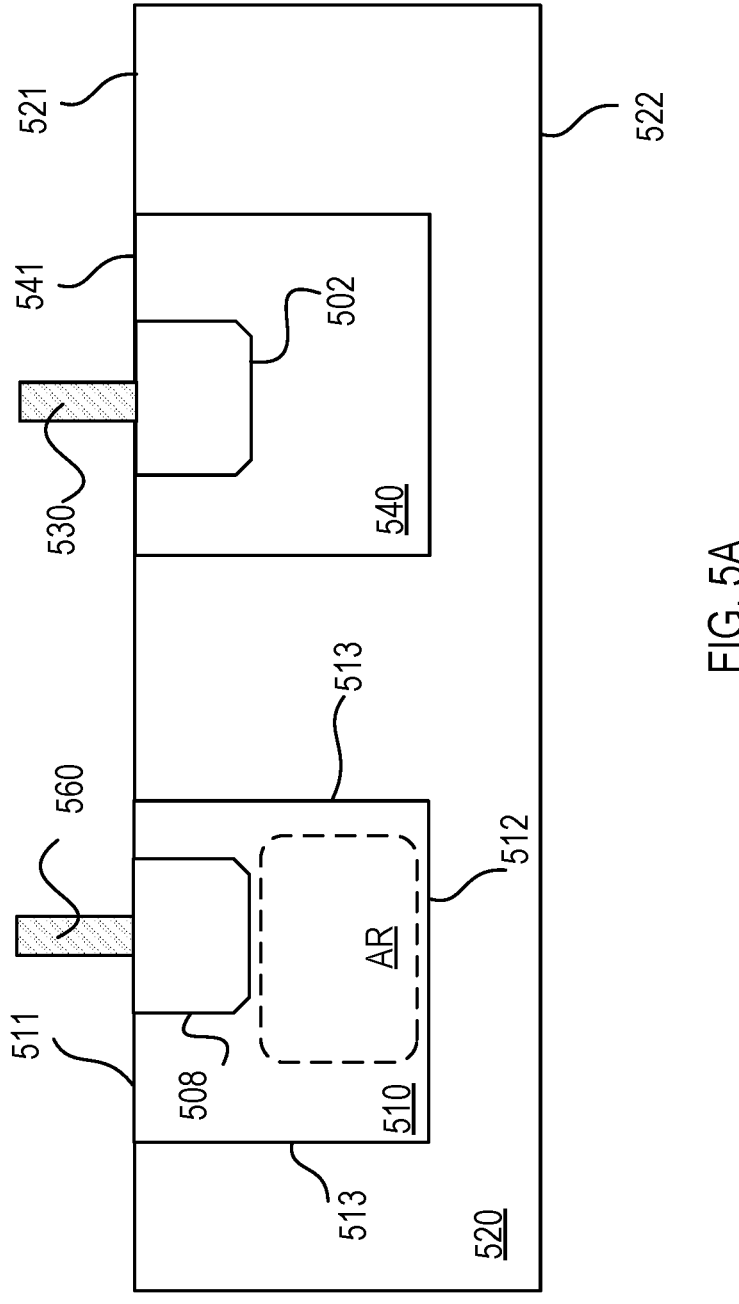
FIG. 5A illustrates a cross-sectional view of a photo-detecting apparatus, according to one or more embodiments of the present disclosure.

FIG. 5A illustrates a cross-sectional view of a photo-detecting apparatus 500a, according to one or more embodiments of the present disclosure. The photo-detecting apparatus 500a can be a photodiode and can be configured for any suitable application.

In some embodiments, as illustrated in FIG. 5A, the photo-detecting apparatus 500a includes an absorption region 510 (e.g., the absorption region 110 of FIGS. 1A-1B, 210 of FIGS. 2A-2B, 310 of FIGS. 3A-3C, 410 of FIGS.

4A-4B) and a substrate 520 (e.g., the substrate 120 of FIG. 1B, 220 of FIG. 2B, 320 of FIGS. 3A-3B, or 420 of FIGS. 4A-4B) that supports the absorption region 510. The absorption region 510 is configured to receive an optical signal and to generate photo-carriers in response to the optical signal. In some embodiments, an output electrical signal is determined by the photo-carriers generated from the absorption region 510. The substrate 520 includes a first material (e.g., silicon), and the absorption region 510 includes a second material (e.g., germanium) different from the first material. In some embodiments, the absorption region 510 is doped with a first dopant (e.g., boron) having a first conductivity type (e.g., p-type).

Figures 8A, 8B, 8C:
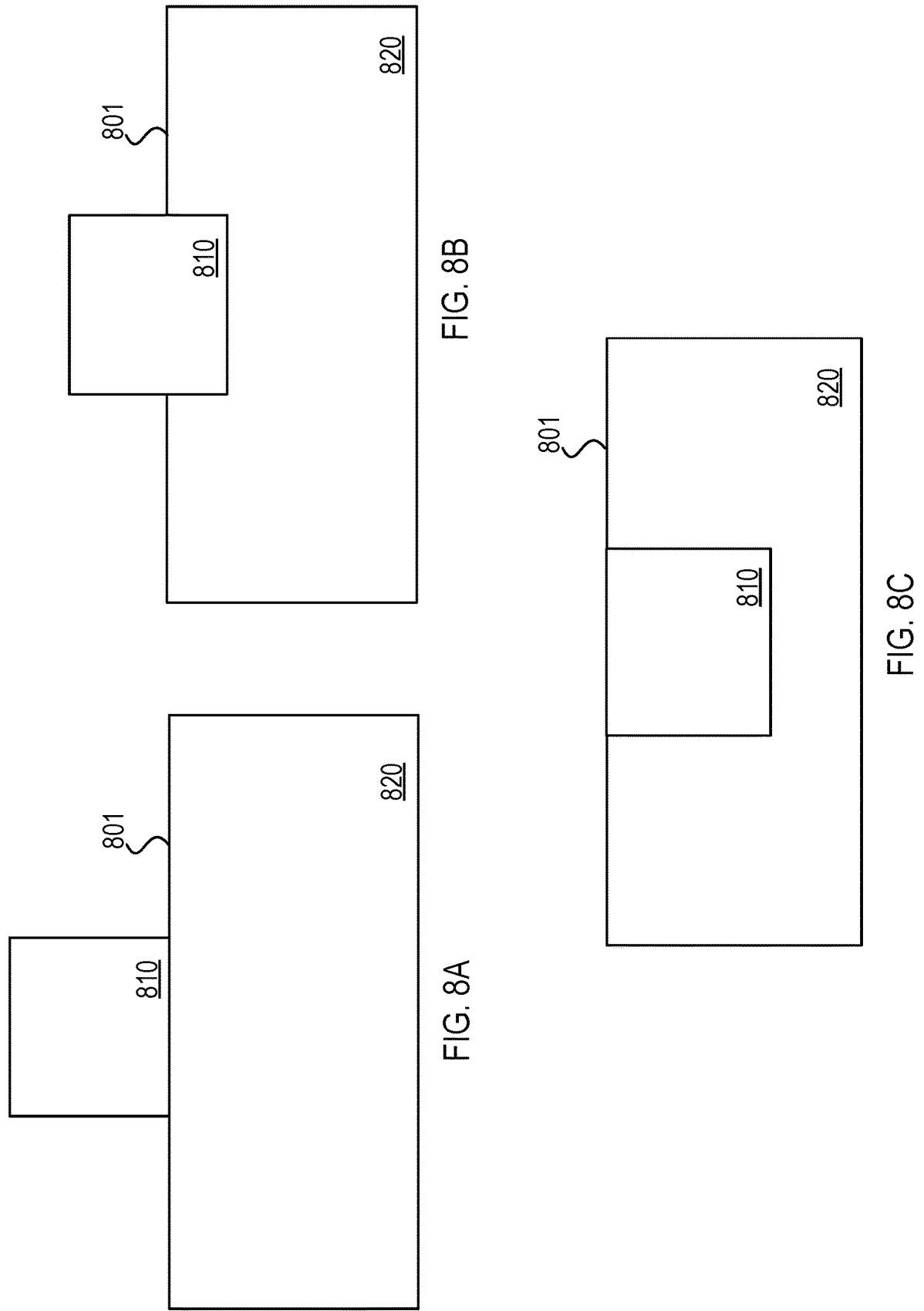
FIGS. 8A-8C illustrate cross-sectional views of a portion of a photo-detecting apparatus, according to one or more embodiments of the present disclosure.

The photo-detecting apparatus 500*a* can further include a density-compensation region 540 supported by the substrate 520 and separated from the absorption region 510. The density-compensation region 540 can include the second material (e.g., germanium), and can be doped with a second dopant (e.g., phosphorus) having a second conductivity type (e.g., n-type) that is opposite from the first conductivity type (e.g., p-type) of the absorption region 510. In some embodiments, the substrate 520 is composed of silicon, the absorption region 510 is composed of germanium, and the density-compensation region 540 is composed of germanium. In some embodiments, at least one of the absorption region 510 or the density-compensation region 540 is partially or fully embedded in the substrate 520 (e.g., as illustrated in FIG. 8B or 8C).

The photo-detecting apparatus 500*a* can further include a first electrode 530 (e.g., 130 of FIGS. 1A-1B) that is formed over a first surface 541 of the density-compensation region 540 and electrically coupled to the density-compensation region 540 and the absorption region 510 to collect a first portion of the photo-carriers (e.g., electrons) generated by the absorption region 510.

The density-compensation region 540 can improve pixel performance and may improve a process yield. From process perspectives, the density-compensation region 540 can be a density compensation (e.g., dummies). That is, to achieve a more desirable distribution (e.g., a more uniform pattern density, a higher overall density, and/or a center/edge compensation, etc.) of the material different from the material of the substrate formed in the trench or recess of the substrate or formed on the substrate in order to improve device yield across a wafer. In some embodiments, when the third material is same as the second material, the additional regions 540 can achieve a more desirable distribution (e.g., more uniform pattern density, higher overall density, center/edge compensation, etc.) of the light absorption material deposited on the substrate or in the trench or recess of the substrate in order to improve device yield across a wafer. However, if the density-compensation region 540 is used merely as dummies, an overall usable area of a device is reduced. Instead, by coupling an electrode (e.g., the first electrode 530) to the density-compensation region 540, and by doping the density-compensation region 540 with a dopant that is different from the absorption region 510, the density-compensation region 540 can be utilized as a useful region (e.g., for readout of photo-carriers detected by the absorption region 510). Accordingly, improved process yields of devices without sacrificing useful areas on the wafer can be achieved.

In some embodiments, the photo-detecting apparatus 500*a* further includes a second electrode 560 (e.g., 160 of FIGS. 1A-1B or 460 of FIGS. 4A-4B) that can be formed over a first surface 521 of the substrate 520 or a first surface 511 of the absorption region 510 and electrically coupled to the absorption region 510. The second electrode 560 is configured to collect a second portion of the photo-carriers (e.g., holes) generated by the absorption region 510.

In some embodiments, the first portion of the photo-carriers collected by the first electrode 530, e.g., electrons, is different from the second portion of the photo-carriers collected by the second electrode 560, e.g., holes. The collected photo-carriers can be processed by separate circuitry (e.g., readout circuitry such as a readout circuit 1054 in FIG. 10B).

In some embodiments, the absorption region 510 includes the first surface 511, a second surface 512, and one or more side surfaces 513. The second surface 512 is between the first surface 511 of the absorption region 510 and a second surface 522 of the substrate 520. The side surfaces 513 are between the first surface 511 and the second surface 512. In some embodiments, at least one of the first surface 511, the second surface 512, or the side surfaces 513 of the absorption region 510 is at least partially in direct contact with the substrate 520, and thus a heterointerface can be formed between the absorption region 510 and the substrate 520.

In some embodiments, the absorption region 510 is doped with the first dopant having the first conductive type (e.g., p-type) and a first peak doping concentration, and at least a part of the substrate 520 (e.g., low-barrier region 610 as described below) or the or the entire substrate 120 is substantially doped with a third dopant (e.g., phosphorus) having the second conductivity type (e.g., n-type) and a second peak doping concentration. A ratio between the first peak doping concentration and the second peak doping concentration can be equal to or greater than a threshold ratio (e.g., 10). The third dopant can be same as the second dopant in the density-compensation region 540.

In some embodiments, the density-compensation region 540 is doped with the second dopant having the second conductivity type (e.g., n-type) and a third peak doping concentration. The third peak doping concentration can be higher than the second peak doping concentration of the substrate 520 or the low-barrier region 610 so as to attract the first portion of the photo-carriers (e.g., electrons) flow to the density-compensation region 540 and then be collected by the first electrode 530.

In some embodiments, the photo-detecting apparatus 500*a* includes a first doped region 502 formed in the density-compensation region 540. The first electrode 530 can be over the first doped region 502. The first doped region 502 is doped with a dopant (e.g., phosphorus) having the second conductivity type (e.g., n-type) and a fourth peak doping concentration. In some embodiments, the fourth peak doping concentration of the first doped region 502 is higher than the third peak doping concentration of the density-compensation region 540.

In some embodiments, the photo-detecting apparatus 500*a* includes a second doped region 508 formed in the absorption region 510 and near the first surface 511 of the absorption region 510. The second electrode 560 can be above the second doped region 508. The second doped region 508 can be doped with the first conductivity type (e.g., p-type). In some embodiments, the second doped region 508 is doped with a dopant (e.g., boron) having a peak doping concentration higher than the first peak doping concentration of the absorption region 510.

Figure 5B:
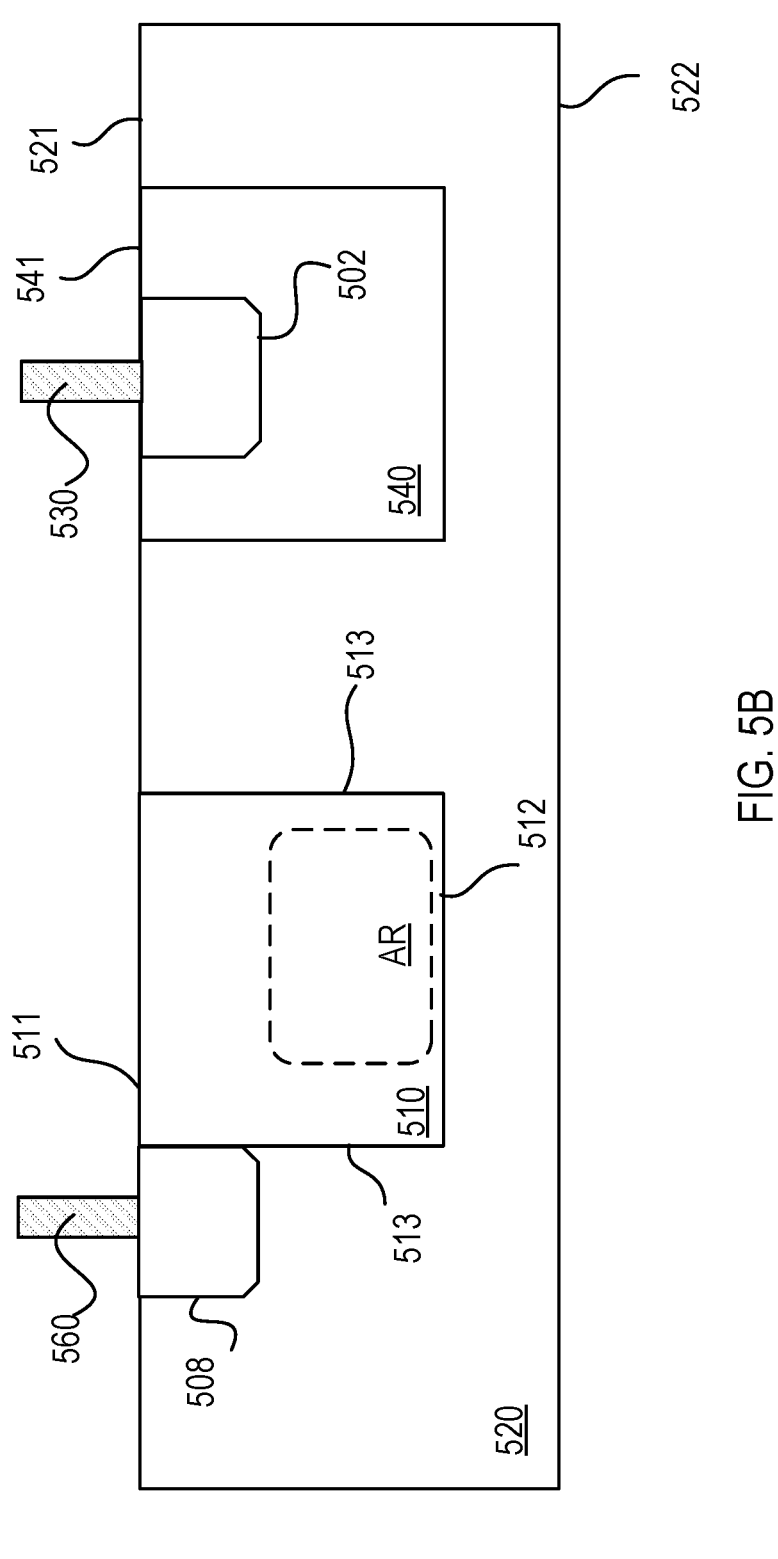
FIG. 5B illustrates a cross-sectional view of another photo-detecting apparatus, according to one or more embodiments of the present disclosure.

FIG. 5B illustrates a cross-sectional view of another photo-detecting apparatus 500*b*, according to one or more embodiments of the present disclosure. The photo-detecting apparatus 500*b* includes a structure substantially same as that of the photo-detecting apparatus 500*a* of FIG. 5A.

However, different from the photo-detecting apparatus 500a of FIG. 5A, the photo-detecting apparatus 500b includes a second doped region 508 formed outside of the absorption region 510. The second electrode 560 is over the first surface 521 of the substrate 520. In some embodiments, as illustrated in FIG. 5B, the second doped region 508 is formed in the substrate 520, near the first surface 521 of the substrate 520, and in contact with the absorption region 510 (e.g., a side surface 513 of the absorption region 510). Since the second doped region 508 is formed in the substrate 520 instead of in the absorption region 510, the area of the absorption region 510 absorbing the optical signal can be larger.

Figure 6A:
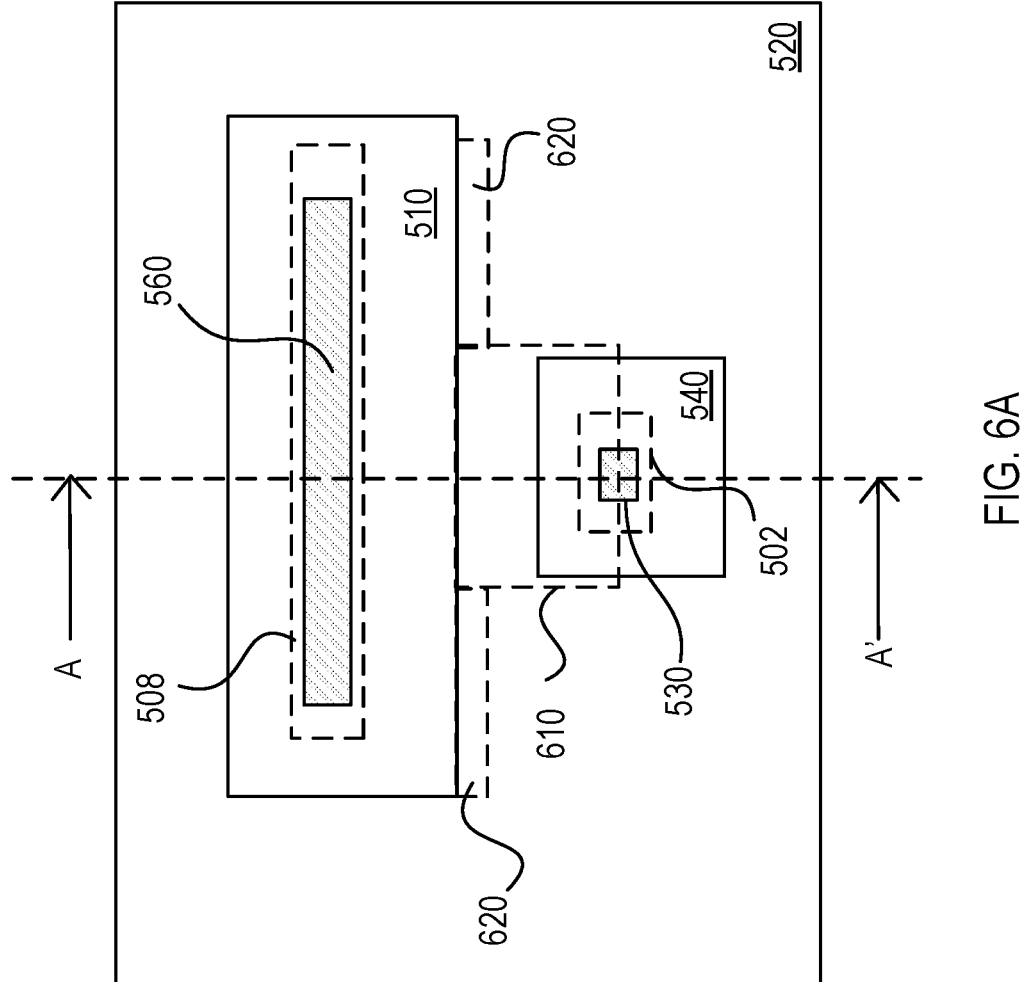
FIG. 6A illustrates a top view of a photo-detecting apparatus, according to one or more embodiments of the present disclosure.
Figure 6A:
Figure 6B:
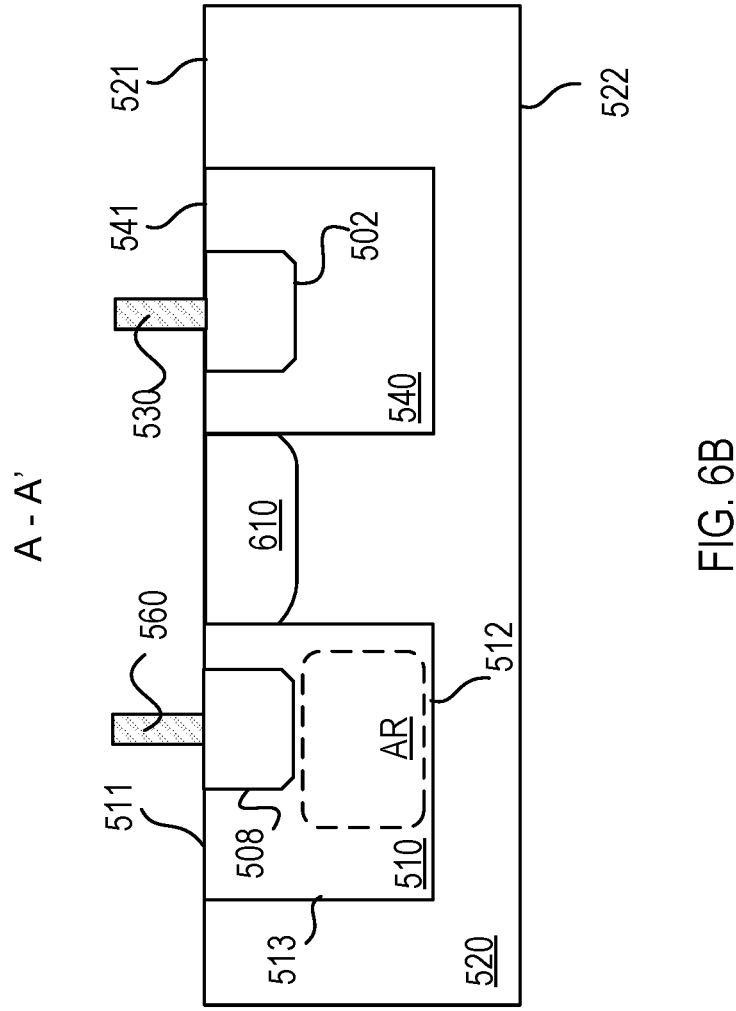
FIG. 6B illustrates a cross-sectional view of the photo-detecting apparatus along an A-A' line in FIG. 6A, according to one or more embodiments of the present disclosure.

FIG. 6A illustrates a top view of a photo-detecting apparatus 600a, according to one or more embodiments of the present disclosure. FIG. 6B illustrates a cross-sectional view of the photo-detecting apparatus 600a along an A-A' line in FIG. 6A.

The photo-detecting apparatus 600a includes a structure substantially same as that of the photo-detecting apparatus 500a of FIG. 5A. However, different from the photo-detecting apparatus 500a, as illustrated in FIGS. 6A-6B, the photo-detecting apparatus 600a includes a low-barrier region 610 in the substrate 520. The low-barrier region 610 can be in contact with the absorption region 510. In some embodiments, at least a part of the low-barrier region 610 is between the absorption region 510 and the density-compensation region 540. In some embodiments, the low-barrier region 610 is doped with the third dopant (e.g., phosphorus) having the second conductivity type (e.g., n-type) and the second peak doping concentration lower than the third peak doping concentration of the density-compensation region 540.

In some embodiments, in the photo-detecting apparatus 600a, as illustrated in FIG. 6A, the substrate 520 further includes a high-barrier region (or a blocking region) 620 in contact with at least a portion of the absorption region 510. In some embodiments, the high-barrier region 620 is doped with a fourth dopant (e.g., boron) of the first conductivity type (e.g., p-type). In some embodiments, the high-barrier region 620 is formed in the substrate 520, or in the absorption region 510, or partially in the substrate 520 and partially in the absorption region 510. The high-barrier region 620 is configured to block or guide a flow of the photo-carriers.

In some embodiments, the substrate 520 can be evenly doped with the third dopant (e.g., phosphorus). In some embodiments, the substrate 520 can be regionally doped with the third dopant (e.g., phosphorus) to form the low-barrier region 610. The low-barrier region 610 can be configured to guide the first portion of the photo-carriers (e.g., electrons) generated by the absorption region 510 in a confined region, such that the first portion of the photo-carriers (e.g., electrons) can flow from the absorption region 510 towards the density-compensation region 540 via the low-barrier region 610 and then be collected by the first electrode 530 since the third peak doping concentration of the density-compensation region 540 is higher than the second peak doping concentration of the low-barrier region 610. In some embodiments, the low-barrier region 610 is in contact with both of the absorption region 510 and the density-compensation region 540 so as to facilitate the carrier transportation between the absorption region 510 and the first doped region 502 formed in the density-compensation region 540.

The other portion of the substrate 520 that is not doped with the second dopant may serve as the high-barrier region 620. In some embodiments, the high-barrier region 620 may be intrinsic, and can be doped with the second dopant with a peak concentration lower than the peak concentration of the low-barrier region 610 or doped with a dopant with a conductivity type different from the second dopant. In some examples, the dopant of the first doped region 502 is n-type, the dopant of the density-compensation region 540 is n-type, the dopant of the absorption region 510 is p-type, the dopant of the high-barrier region 620 is p-type, and the dopant of the low-barrier region 610 is n-type.

In some embodiments, if the first electrode 530 is designed to collect electrons, the energy barrier for the electrons is higher in the high-barrier region 620 than in the low-barrier region 610. As a result, electrons can be directed toward and be collected by the first electrode 530. In some embodiments, an area of the high-barrier region 620 is greater than an area of the low-barrier region 610, which confines a path for the carriers passing through and leads to a confined region at the heterointerface for the carriers exiting from the absorption region 510, which reduces the dark-current of the photo-detecting apparatus 600a.

In some embodiments, when the photo-detecting apparatus 600a is configured to collect electrons, the dopant of the high-barrier region 620 is p-type, and the dopant of the density-compensation region 540 is n-type. After the photo-carriers are generated from the absorption region 510, the holes can be collected by the second electrode 560, and the electrons can be blocked by the high-barrier region 620 and move from the absorption region 510 towards the density-compensation region 540 through the low-barrier region 610, instead of moving out from the whole heterointerface between the absorption region 510 and the substrate 520, which reduces the dark-current of the photo-detecting apparatus 600a.

Figure 6C:
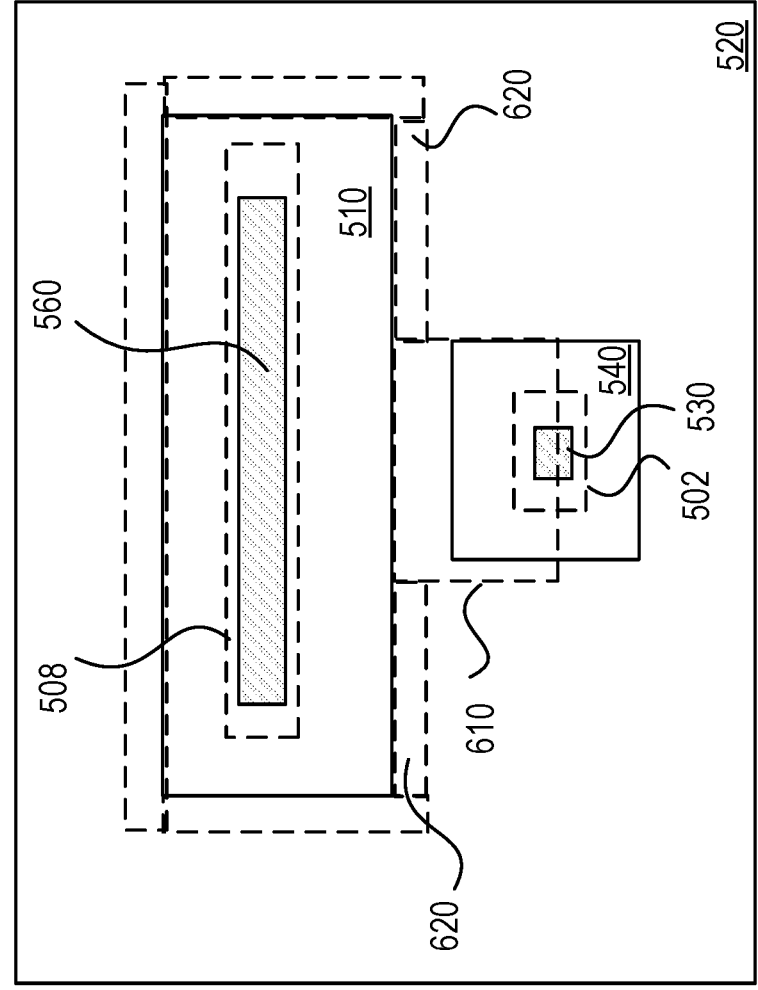
FIG. 6C illustrates a top view of a photo-detecting apparatus, according to one or more embodiments of the present disclosure.
Figure 6C:
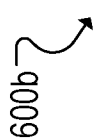

FIG. 6C illustrates a top view of another photo-detecting apparatus 600b, according to one or more embodiments of the present disclosure. The photo-detecting apparatus 600b includes a structure substantially same as that of the photo-detecting apparatus 600a of FIGS. 6A-6B. However, different from the high-barrier region 620 in the photo-detecting apparatus 600a of FIGS. 6A-6B, a high-barrier region 620 in the photo-detecting apparatus 600b is extended to cover two or more sides of the absorption region 510 to further confine the carriers to pass through the low-barrier region 610 instead of moving out from other sides of the absorption region 510. The peak doping concentration of the high-barrier region 620 may be higher or lower than the peak doping concentration of the second doped region 508. In some embodiments, the high-barrier region 620 and the second doped region 508 are formed by two different fabrication process steps, e.g., using different masks.

In some embodiments, the first peak doping concentration of the absorption region 510 can be between $1\times10^{16}$ cm$^{-3}$ and $1\times10^{20}$ cm$^{-3}$. In some embodiments, the high-barrier region 620 has a peak doping concentration, which can be equal to or greater than $1\times10^{16}$ cm$^{-3}$.

In some embodiments, a ratio of the first peak doping concentration to the second peak doping concentration of the substrate 520 or the low-barrier region 610 is equal to or greater than 10 such that a photo-detecting apparatus, e.g., 500a, 500b, 600a, or 600b, can further achieve a low dark current. In some embodiments, a ratio of the first peak doping concentration to the second peak doping concentration is equal to or greater than 100, such that the photo-detecting apparatus can achieve a further low dark current and a high quantum efficiency at the same time.

Figure 6D:
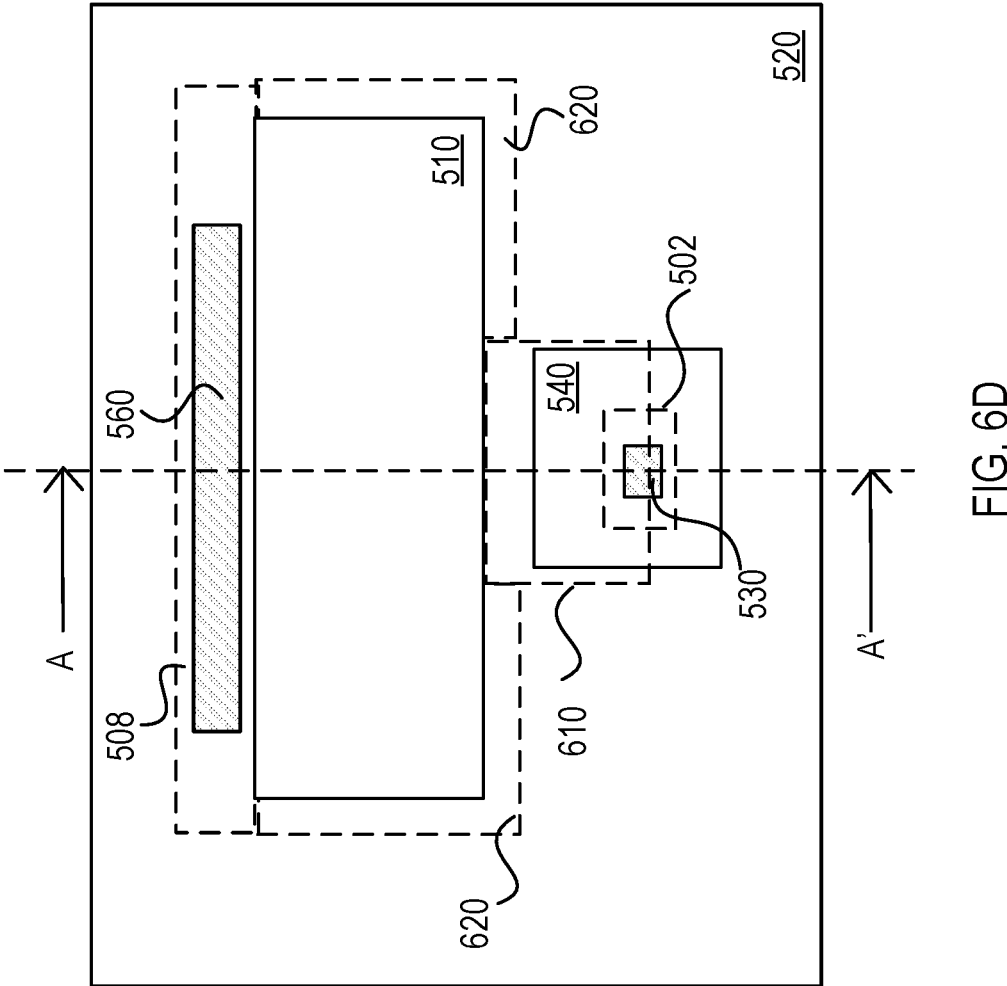
FIG. 6D illustrates a top view of a photo-detecting apparatus, according to one or more embodiments of the present disclosure.
Figure 6D:
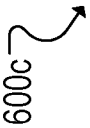

FIG. 6D illustrates a top view of another photo-detecting apparatus 600c, according to one or more embodiments of the present disclosure. FIG. 6E illustrates a cross-sectional view of the photo-detecting apparatus 600c along an A-A' line in FIG. 6D.

The photo-detecting apparatus 600c includes a structure substantially same as that of the photo-detecting apparatus 600b of FIG. 6C, and can include a low-barrier region 610 and a high-barrier region 620 that are substantially same as those in the photo-detecting apparatus 600c. The photo-detecting apparatus 600c is also similar to the photo-detecting apparatus 500b of FIG. 5B, and includes a second doped region 508 formed outside of the absorption region 510, where the second doped region 508 is similar to the second doped region 508 in the photo-detecting apparatus 500b. In some embodiments, as illustrated in FIG. 6E, the second doped region 508 is formed in the substrate 520, near the first surface 521 of the substrate 520, and in contact with the absorption region 510 (e.g., a side surface 513 of the absorption region 510).

A photo-detecting apparatus can include one or more switches. As described with further details below, FIGS. 7A-7D illustrate dual-switch photo-detecting apparatus with different configurations, and FIG. 7E illustrates a single-switch photo-detecting apparatus.

Figure 7A:
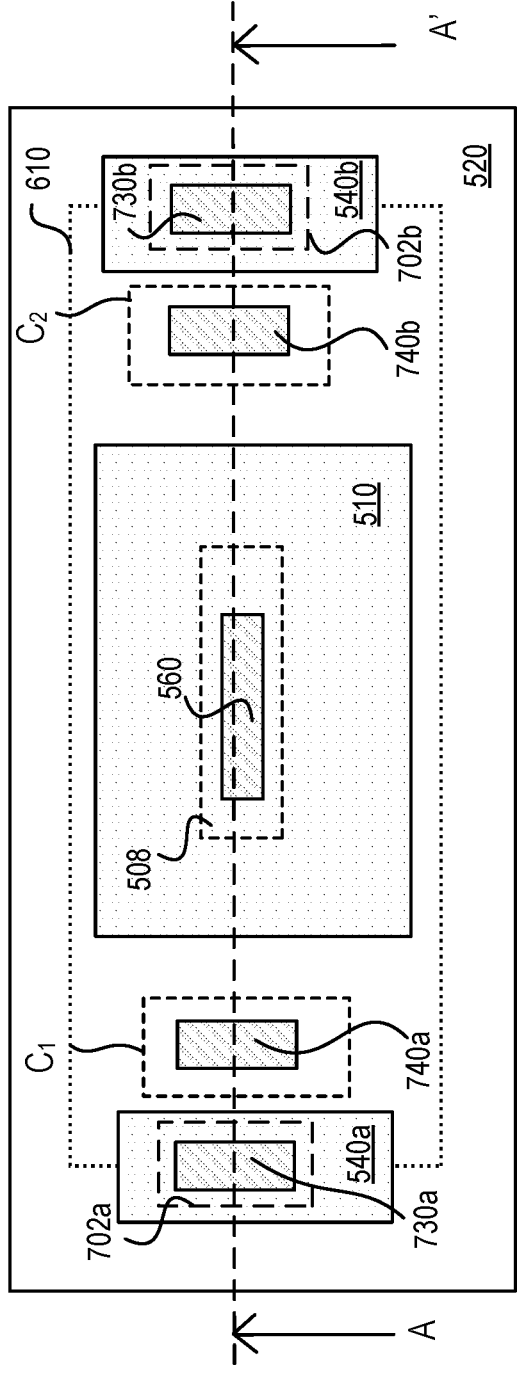
FIG. 7A illustrates a top view of a dual-switch photo-detecting apparatus, according to one or more embodiments of the present disclosure.
Figure 7B:
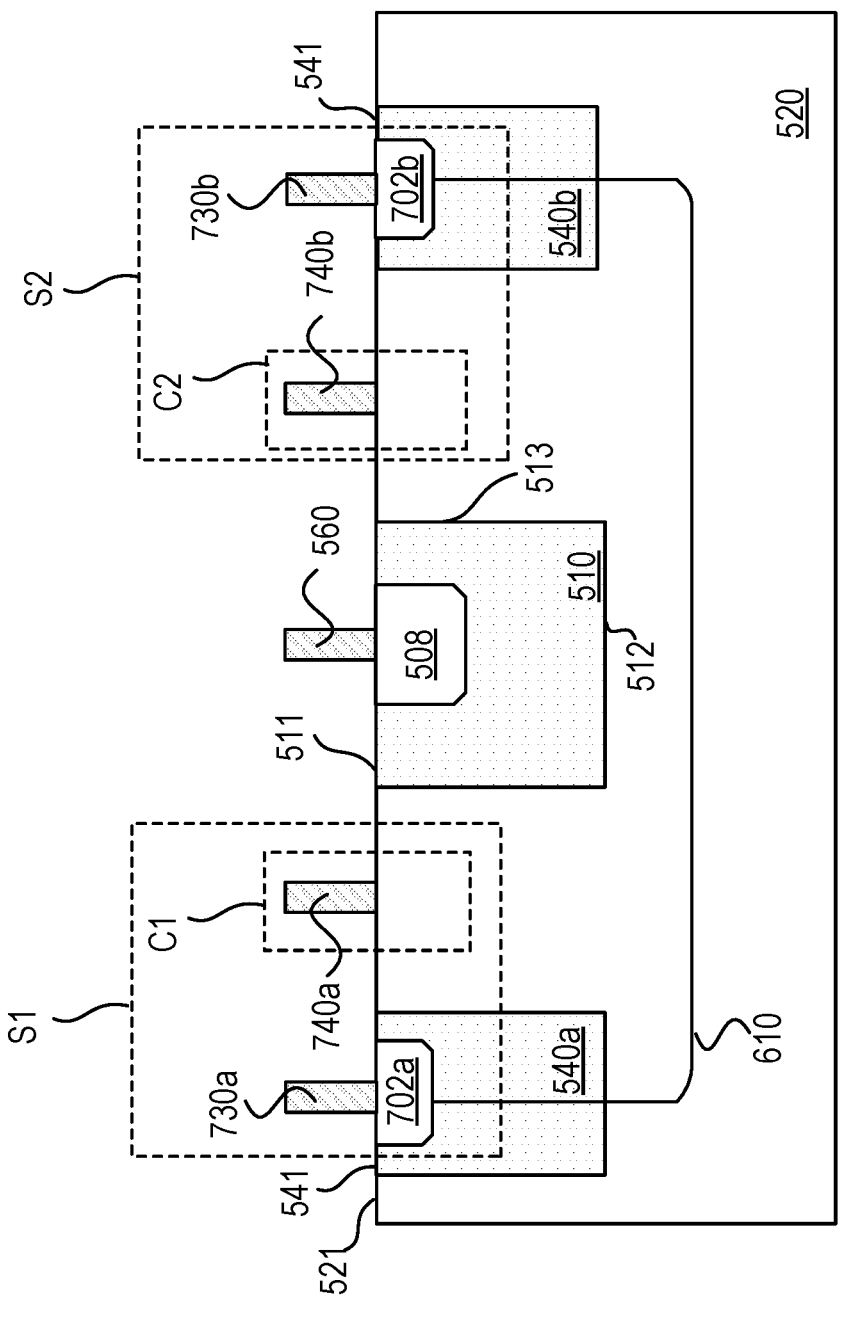
FIG. 7B illustrates a cross-sectional view of the dual-switch photo-detecting apparatus along an A-A' line in FIG. 7A, according to one or more embodiments of the present disclosure.

FIG. 7A illustrates a top view of a dual-switch photo-detecting apparatus 700a, according to one or more embodiments of the present disclosure. FIG. 7B illustrates a cross-sectional view of the dual-switch photo-detecting apparatus 700a along an A-A' line in FIG. 7A, according to one or more embodiments of the present disclosure.

The dual-switch photo-detecting apparatus 700a can be a pixel in an i-ToF (Time of Flight) sensor. The photo-detecting apparatus 700a includes a substrate 520 (e.g., the substrate 120 of FIG. 1B, 220 of FIG. 2B, 320 of FIG. 3B, 420 of FIGS. 4A-4B, or 520 of FIGS. 5A-5B and 6A-6E) and an absorption region 510 (e.g., the absorption region 110 of FIGS. 1A-1B, 210 of FIGS. 2A-2B, 310 of FIGS. 3A-3C, 410 of FIGS. 4A-4B, or 510 of FIGS. 5A-5B and 6A-6E) supported by the substrate 520. The absorption region 510 is configured to receive an optical signal and to generate photo-carriers in response to the optical signal. The substrate 520 includes a first material (e.g., silicon), and the absorption region 510 includes a second material (e.g., germanium) different from the first material. The absorption region 510 can be doped with the first dopant (e.g., boron) having the first conductivity type (e.g., p-type).

The photo-detecting apparatus 700a further includes one or more density-compensation regions 540a, 540b supported by the substrate 520 and separated from the absorption region 510. Each density compensation region 540a, 540b can be the density compensation region 540 of FIGS. 5A-5B or FIGS. 6A-6E. In some embodiments, at least a part of the absorption region 510 or at least a part of the one or more density-compensation regions 540a, 540b are embedded in the substrate 520.

Each density-compensation region 540a, 540b can include the second material and be doped with the second dopant (e.g., phosphorus) having the second conductivity type (e.g., n-type) that is opposite from the first conductivity type. In some embodiments, the substrate 520 is composed of silicon, the absorption region 510 is composed of germanium, and the one or more density-compensation regions 540a, 540b are composed of germanium.

As illustrated in FIG. 7B, the photo-detecting apparatus 700a includes two switches S1 and S2 electrically coupled to the absorption region 510 and partially formed in the substrate 520. Each of the two switches S1, S2 includes a readout electrode 730a, 730b (e.g., the first electrode 530 of FIGS. 5A-5B, 6B, or 6E) and a control region C1, C2 having a control electrode 740a, 740b. Each readout electrode 730a, 730b is formed over a first surface 541 of the corresponding density-compensation region 540a, 540b and electrically coupled to the corresponding density-compensation region 540a, 540b and the absorption region 510 to collect a first portion of the photo-carriers (e.g., electrons) generated by the absorption region 510. In some embodiments, the control electrodes 740a, 740b are formed over a first surface 521 of the substrate 520 and are separated from the absorption region 510.

In some embodiments, the photo-detecting apparatus 700a includes a low-barrier region 610 (e.g., 610 of FIGS. 6A-6E) in the substrate 520 in contact with the absorption region 510. In some embodiments, at least a part of the low-barrier region 610 is between the absorption region 510 and the one or more density-compensation regions 540a, 540b. In some embodiments, the low-barrier region 610 is in contact with both of the absorption region 510 and the density-compensation region 540.

In some embodiments, in the photo-detecting apparatus 700a, the absorption region 510 has a first peak doping concentration, and the substrate 520 or the low-barrier region 610 is doped with the third dopant (e.g., phosphorus) having the second conductivity type (e.g., n-type) and a second peak doping concentration. A ratio between the first peak doping concentration of the absorption region 510 and the second peak doping concentration of the substrate 520 can be equal to or greater than 10.

In some embodiments, similar to the density-compensation region 540 of FIGS. 5A-5B and 6A-6E, at least one of the one or more density-compensation regions 540a, 540b can have a third peak doping concentration higher than the second peak doping concentration of the substrate 520 or the low-barrier region 610 so as to attract the first portion of the photo-carriers (e.g., electrons) flow into the density-compensation region 540a, 540b and then be collected by the corresponding readout electrodes 730a, 730b.

In some examples, the second peak doping concentration of the substrate 520 or the low-barrier region 610 ranges from $1 \times 10^{15}$ cm$^{-3}$ to $1 \times 10^{17}$ cm$^{-3}$. In some examples, the third peak doping concentration of the density-compensation region 540a, 540b ranges from $1 \times 10^{17}$ cm$^{-3}$ to $1 \times 10^{18}$ cm$^{-3}$.

In some embodiments, the photo-detecting apparatus 700a is configured to receive two control signals (e.g., a first control signal and a second control signal) for respectively controlling the control regions C1, C2 of the two switches S1, S2 to control the moving direction of the electrons or holes generated by absorbed photons in the absorption region 510. The control signals can be modulated signals.

In some embodiments, the first control signal is different from the second control signal. For example, when control signals are used to provide different voltages and thus generate bias voltage, an electric field is created between the two portions right under the control electrodes 740a, 740b as well as in the absorption region 510, and free carriers in the absorption region 510 drift towards one of the portions right under the readout electrodes 730a, 730b depending on the direction of the electric field. In some embodiments, the first control signal includes a first phase, and the second control signal includes a second phase, and the first control phase is not overlapped with the second control phase. In some embodiments, the first control signal is fixed at a voltage value V, and the second control signal alternates between voltage values V±ΔV. In some embodiments, the bias value ΔV is generated by a varying voltage signal, e.g., a sinusoid signal, a clock signal, or a pulse signal, operated between 0 V and 3 V. The direction of the bias value $\Delta V$ determines the drift direction of the carriers generated from the absorption region 510.

In some embodiments, as illustrated in FIGS. 7A and 7B, the first switch S1 includes a carrier-output region 702a (e.g., the carrier-output region 311 of FIGS. 3B-3C or 402a in FIG. 4A) under the readout electrode 730a, and the second switch S2 includes a carrier-output region 702b (e.g., the carrier-output region 311 of FIGS. 3B-3C or 402a in FIG. 4A) under the readout electrode 730b. In some embodiments, the carrier-output regions 702a, 702b are formed in the density-compensation regions 540a, 540b, respectively. In some embodiments, the first carrier-output regions 702a, 702b are of the second conductivity type (e.g., n-type). In some embodiments, the first carrier-output region s 702a, 702b are doped with a dopant (e.g., phosphorus) and a peak doping concentration. In some embodiments, the peak doping concentrations of the first carrier-output region s 702a, 702b are higher than the third peak doping concentration of the density-compensation regions 540a, 540b, respectively.

In some embodiments, the peak doping concentrations of the first carrier-output region s 702a, 702b depend on the material of the readout electrodes 730a, 730b and the material of the substrate 520. The peak doping concentrations can be between $5 \times 10^{18}$ cm$^{-3}$ to $5 \times 10^{20}$ cm$^{-3}$. The first carrier-output region s 702a, 702b are carrier collection regions for collecting the first portion of the photo-carriers (e.g., electrons) generated by the absorption region 510 based on the control of the two control signals.

Figure 7C:
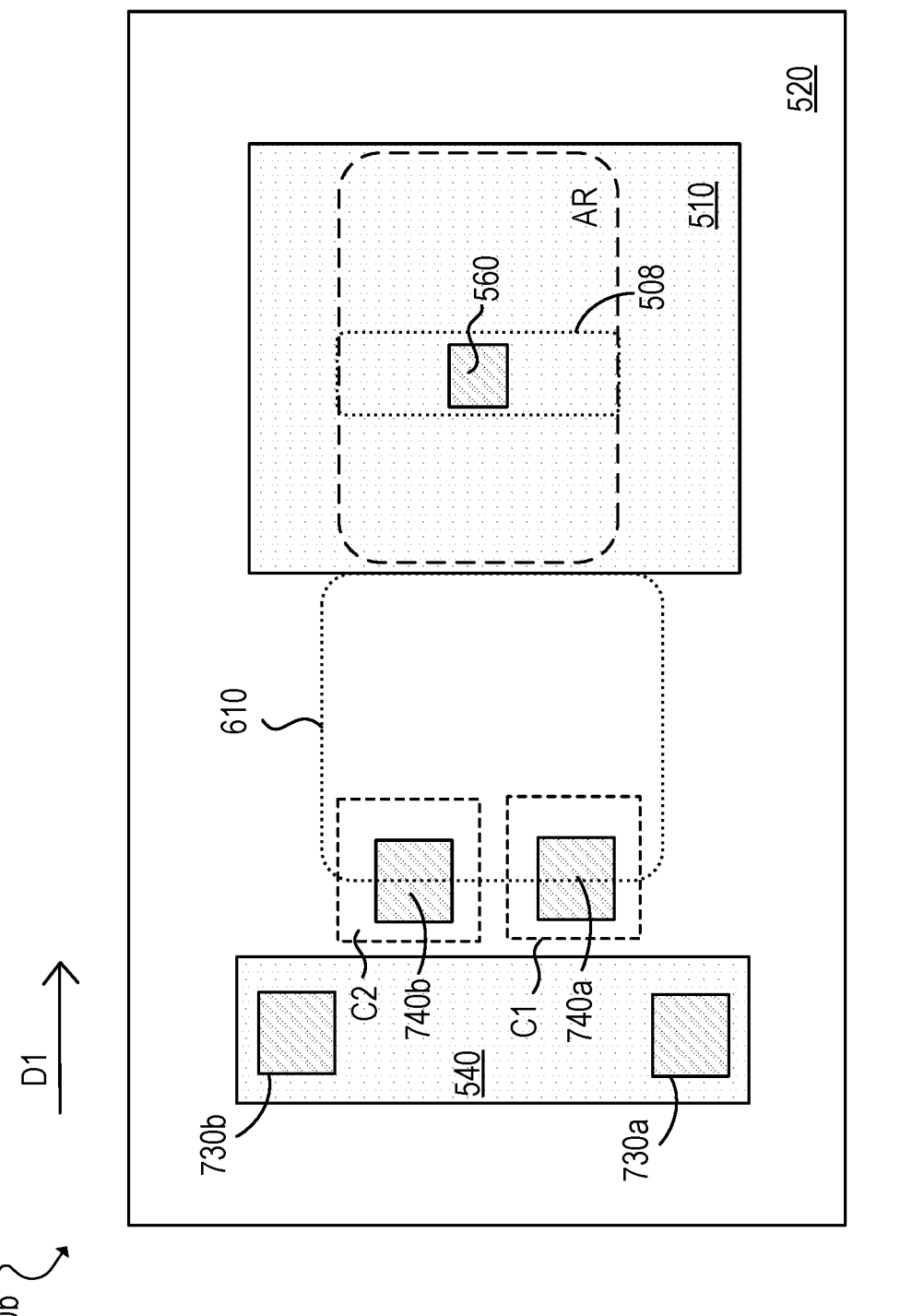
FIG. 7C illustrates a top view of another dual-switch photo-detecting apparatus, according to one or more embodiments of the present disclosure.

FIG. 7C illustrates a cross-sectional view of another photo-detecting apparatus 700b, according to one or more embodiments of the present disclosure. The photo-detecting apparatus 700b includes a structure substantially same as that of the photo-detecting apparatus 700a of FIGS. 7A-7B. However, in the photo-detecting apparatus 700a, the readout electrodes 730a, 730b and the control electrodes 740a, 740b are disposed at different sides of the absorption region 510. In contrast, in the photo-detecting apparatus 700b, as illustrated in FIG. 7C, the readout electrodes 730a, 730b and the control electrodes 740a, 740b are disposed at the same side of the absorption region 510 along a first direction D1. The control electrodes 740a, 740b can be arranged along a second direction perpendicular to the first direction D1.

In the photo-detecting apparatus 700b, the readout electrodes 730a, 730b can be arranged along the second direction perpendicular to the first direction. The control electrodes 740a, 740b can be arranged between the readout electrodes 730a, 730b and the absorption region 510.

In some embodiments, as illustrated in FIG. 7C, the readout electrodes 730a, 730b on the same side of the absorption region 510 can be arranged on top of a density-compensation region 540. At least a part of a low-barrier region 610 is between the absorption region 510 and the density-compensation region 540 so as to facilitate carrier transportation.

Figure 7D:
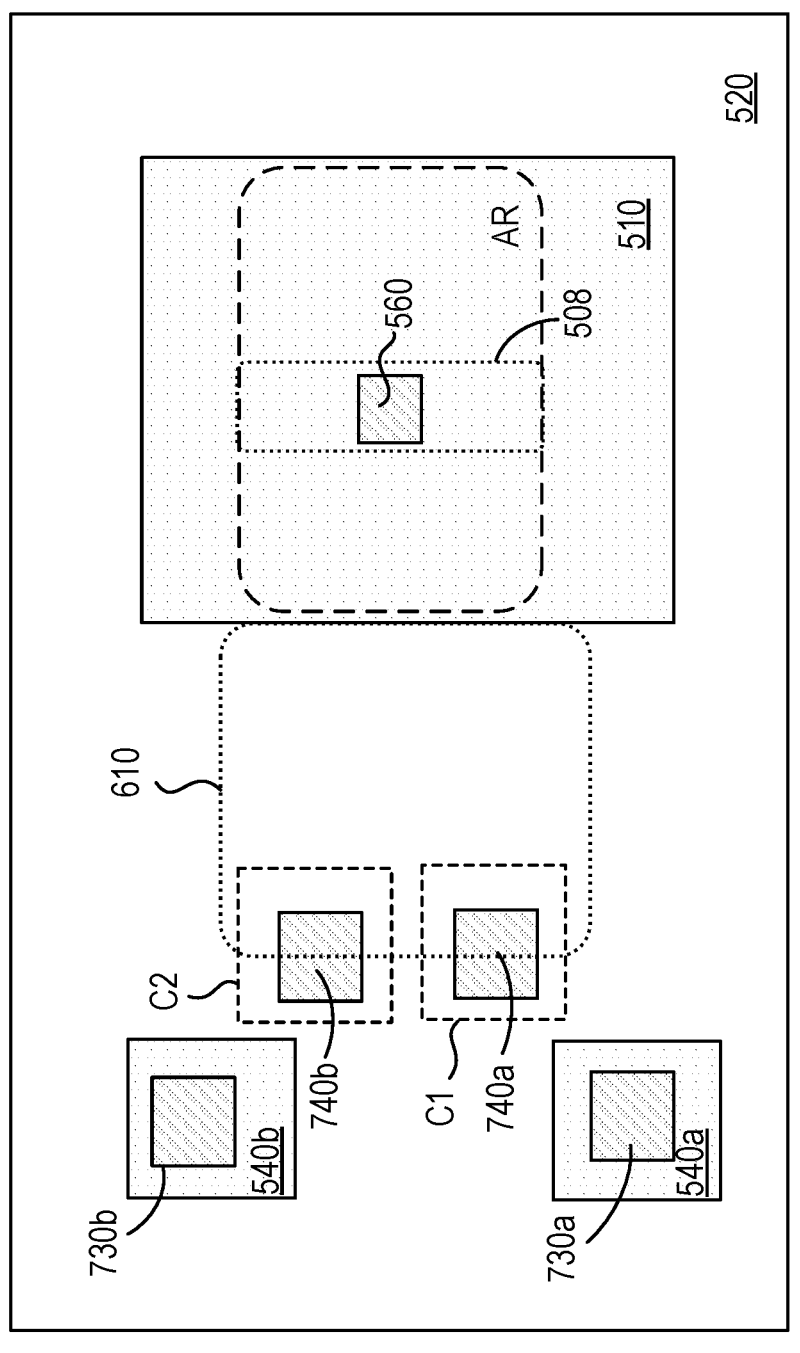
FIG. 7D illustrates a top view of another dual-switch photo-detecting apparatus, according to one or more embodiments of the present disclosure.
Figure 7E:
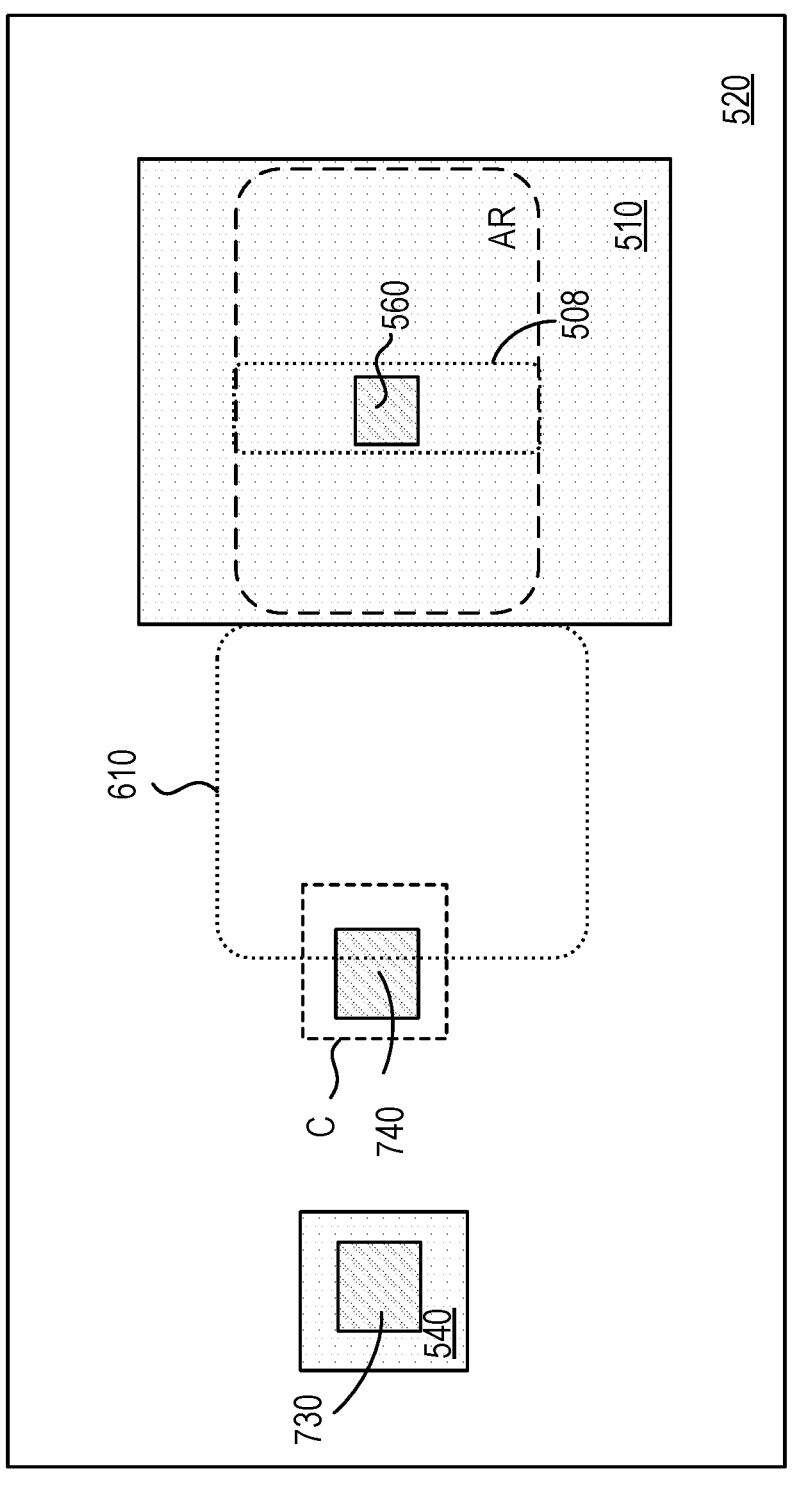
FIG. 7E illustrates a top view of a single-switch photo-detecting apparatus, according to one or more embodiments of the present disclosure.

FIG. 7D illustrates a cross-sectional view of another photo-detecting apparatus 700c, according to one or more embodiments of the present disclosure. The photo-detecting apparatus 700c includes a structure substantially same as that of the photo-detecting apparatus 700b of FIG. 7C. However, different from the photon-detecting apparatus 700b where the readout electrodes 730a, 730b are arranged on top of a same density-compensation region 540, the photo-detecting apparatus 700c includes two readout electrodes 730a, 730b arranged on two corresponding density-compensation regions 540a, 540b, respectively. In some embodiments, at least a part of a low-barrier region 610 is between the absorption region 510 and the density-compensation region 540 so as to facilitate carrier transportation.

FIG. 7E illustrates an example single-switch photo-detecting apparatus 700d. The single-switch photo-detecting apparatus 700d has a structure substantially same as the dual-switch photo-detecting apparatus 700a, 700b, or 700c, except that the single-switch photo-detecting apparatus 700d has a single switch S (e.g., S1 or S2 of FIGS. 7A-7D) including a readout electrode 730 (e.g., 730a or 730b of FIGS. 7A-7D) on top of a density-compensation region 540 (e.g., 540, 540a, or 540b of FIGS. 7A-7D) and a control region C (e.g., C1 or C2 of FIGS. 7A-7D) having a control electrode 740 (e.g., 740a or 740b of FIGS. 7A-7D). In some embodiments, at least a part of a low-barrier region 610 is between the absorption region 510 and the density-compensation region 540 so as to facilitate carrier transportation.

It should be understood that the elements mentioned in the present disclosure can be combined in any manner and in any number to create additional embodiments. For example, the second doped region 508 in FIGS. 7A-7E can be formed in the substrate 520, as described in FIG. 6D. The second electrode 560 can be formed over the first surface 521 of the substrate 520. For another example, the photo-detecting apparatus 700b, 700c, 700d can further includes a high-barrier region (e.g., the high-barrier region 620 of FIGS. 6A-6E) in contact with the absorption region 510. In some embodiments, the high-barrier region can be at least in contact with a part of the side surfaces 513 of the absorption region 510 not in contact with the low-barrier region 610 so as to block and thus further confine the carriers flowing towards the readout electrode(s) (e.g., readout electrode 730a, 730b, 730) disposed at the low-barrier region 610 side through the low-barrier region 610. For another example, the photo-detecting apparatus 100 can further includes blocking layer 204 surrounding the additional regions 150. The second doped region 108 of the photo-detecting apparatus 100 can be formed in the substrate 120 in a similar way described in FIG. 4A. In some embodiments, if not specifically mentioned, the cross-sectional views shown in the present disclosure may be a cross-sectional view along any possible cross-sectional line of a photo-detecting apparatus or a photo-detecting apparatus.

FIGS. 8A-8C illustrate cross-sectional views of a portion of a photo-detecting apparatus, according to one or more embodiments of the present disclosure. The photo-detecting apparatus, can include a structure substantially same as any embodiment described before. The photo-detecting apparatus includes an absorption region 810 (e.g., the absorption region 110 of FIGS. 1A-1B, 210 of FIGS. 2A-2B, 310 of FIGS. 3A-3C, 410 of FIGS. 4A-4B, or 510 in any one of FIGS. 5A-5B, 6A-6E, or 7A-7E) and a substrate 820 (e.g., the substrate 120 of FIG. B1, 220 of FIG. 2B, 320 of FIG. 3B, 420 of FIG. 4A-4B, or 520 in any one of FIGS. 5A-5B, 6A-6E, or 7A-7E). The substrate 820 has a surface 801 (e.g., the surface 521 in any one of FIGS. 5A-5B).

In some embodiments, as illustrated in FIG. 8A, the absorption region 810 is entirely on the surface 801 of the substrate 820. In some embodiments, as illustrated in FIG. 8B, the absorption region 810 is partially embedded in the substrate 820. That is, a part of each of side surfaces (e.g., the side surface 513 in FIG. 5A or 5B) of the absorption region 810 is in contact with the substrate 820. In some embodiments, as illustrated in FIG. 8C, the absorption region 810 is entirely embedded in the substrate 820. That is, the entire side surfaces of the absorption region 810 are in contact with the substrate 820.

FIGS. 9A-9D show examples of arrangements of a control region of a switch in a photo-detecting apparatus, according to one or more embodiments of the present disclosure. The photo-detecting apparatus can include a structure substantially same as any embodiment described before, e.g., 400 of FIG. 4A-4B, 700a, 700b, 700c, or 700d of FIGS. 7A to 7E. The switch can be the switch S1 or S2 in any one of FIGS. 4A-4B or FIGS. 7A to 7E. The control region can be the control region C1, C2, or C of FIGS. 4A-4B or FIGS. 7A to 7E. The control region can include a control electrode 940 (e.g., the control electrode 440a, 440b of FIGS. 4A-4B or 740a, 740b, or 740 in any one of FIGS. 7A to 7E).

In some embodiments, as illustrated in FIG. 9A, the control electrode 940 can be over a first surface 901 of a structure 910 with an intrinsic region right under the control electrode 940. The structure 910 can be a substrate (e.g., the substrate 120 of FIG. B1, 220 of FIG. 2B, 320 of FIG. 3B, 420 of FIG. 4A-4B, or 520 in any one of FIGS. 5A-5B, 6A-6E, 7A-7E, or 8A-8C) or an absorption region (e.g., the absorption region 110 of FIGS. 1A-1B, 210 of FIGS. 2A-2B, 310 of FIGS. 3A-3C, 410 of FIGS. 4A-4B, or 510 in any one of FIGS. 5A-5B, 6A-6E, 7A-7E, or 8A-8C). The control electrode 940 may lead to formation of a Schottky contact, an Ohmic contact, or a combination thereof having an intermediate characteristic between the two, depending on various factors including the material of the substrate, the material of the absorption region, the material of a passivation layer (e.g., the passivation layer 207 of FIG. 2B or 3B), and/or the material of the control electrode 940, and/or the dopant or defect level of the substrate, the absorption region or the passivation layer.

In some embodiments, as illustrated in FIG. 9B, the control region of the switch further includes a doped region 903 (e.g., the carrier control region 312 of FIG. 3B), under the control electrode 940 and in the structure 910 (e.g., the substrate or the absorption region). In some embodiments, the doped region 903 can be of a conductivity type different from the conductivity type of carrier-collection regions (e.g., the first doped regions 702a, 702b of FIGS. 7A-7B). In some embodiments, the doped region 903 includes a dopant and a dopant profile. A peak dopant concentration of the doped region 903 depends on the material of the control electrode 940 and/or the material of the structure 910, and/or the dopant or defect level of the structure 910 (e.g., the substrate). The peak dopant concentration can be, e.g., between $1 \times 10^{17}$ cm$^{-3}$ to $5 \times 10^{20}$ cm$^{-3}$. The doped region 903 can form a Schottky or an Ohmic contact or a combination thereof with the control electrode 940. The doped region 903 is for demodulating the carriers generated from the absorption region based on the control of the control signals.

In some embodiments, as illustrated in FIG. 9C, the control region of the switch further includes a dielectric layer 950 that can be formed between the structure 910 (e.g., the substrate or the absorption region) and the control electrode 940. The dielectric layer 950 prevents direct current conduction from the control electrode 940 to the structure 910, but allows an electric field to be established within the structure 910, in response to an application of a voltage to the control electrode 940. The established electric field between two of the control regions, for example, between the control regions C1, C2, may attract or repel charge carriers within the structure 910.

In some embodiments, as illustrated in FIG. 9D, the control region of the switch includes both a doped region 903 and the dielectric layer 950. The doped region can be a carrier control region (e.g., the carrier control region 312 of FIG. 3B), under the control electrodes 940 and in the structure 910. The dielectric layer 950 can be between the doped region 903 and the control electrode 940.

In some embodiments, the dielectric layer 950 may include, but is not limited to, $SiO_2$. In some embodiments, the dielectric layer 950 may include a high-k material including, but is not limited to, $Si_3N_4$, SiON, $SiN_x$, $SiO_x$, $GeO_x$, $Al_2O_3$, $Y_2O_3$, $TiO_2$, $HfO_2$ or $ZrO_2$. In some embodiments, the dielectric layer 950 may include semiconductor material but is not limited to amorphous Si, polycrystalline Si, crystalline Si, germanium-silicon, or a combination thereof.

Figure 10A:
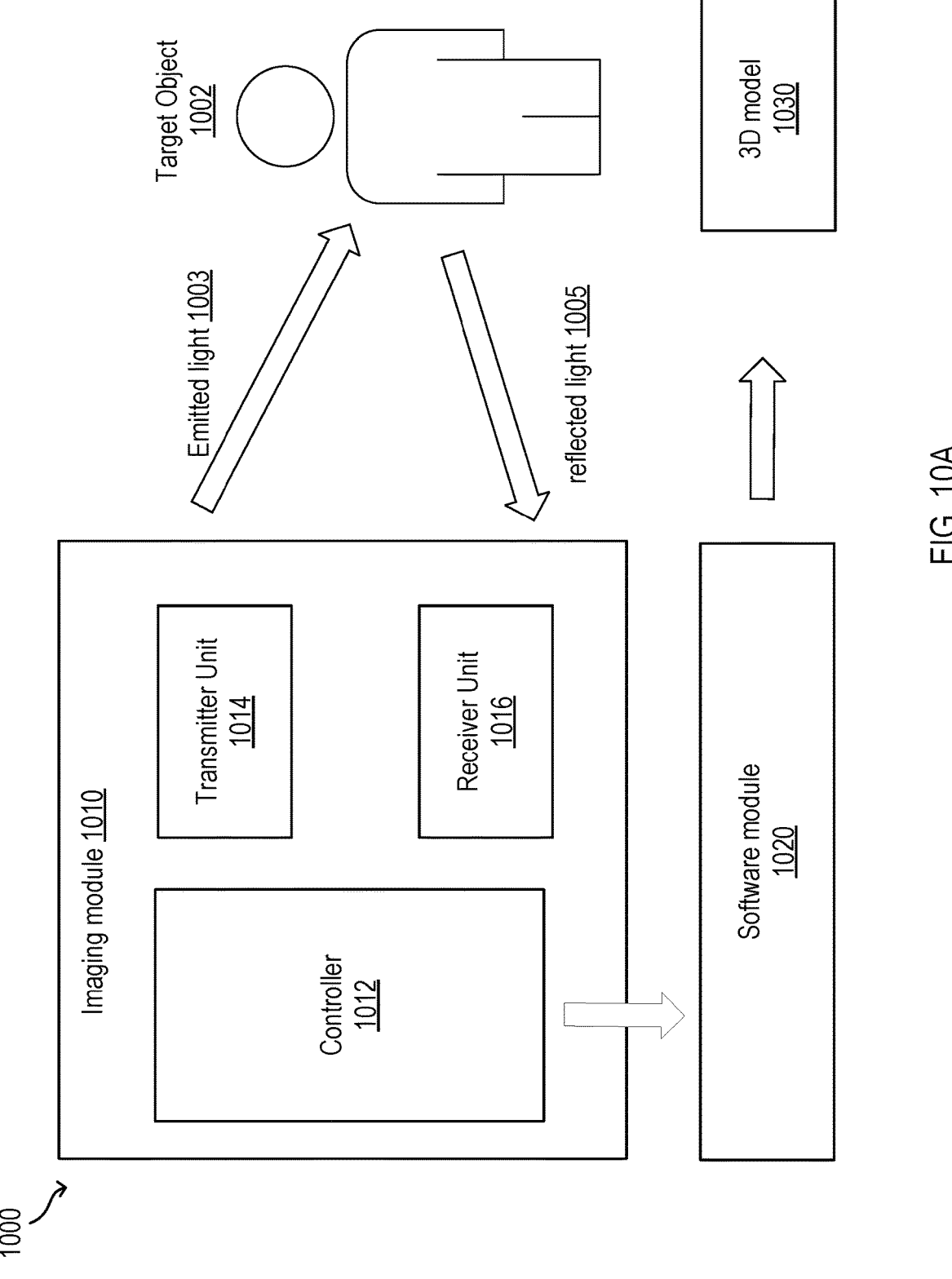
FIG. 10A is a block diagram of an example embodiment of an imaging system.

FIG. 10A is a block diagram of an example embodiment of an imaging system 1000. The imaging system 1000 may include an imaging module 1010 and a software module 1020 configured to reconstruct a three-dimensional (3D) model 1030 of a detected object 1002. The imaging system 1000 or the imaging module 1010 may be implemented on a mobile device (e.g., a smartphone, a tablet, vehicle, drone, etc.), an ancillary device (e.g., a wearable device) for a mobile device, a computing system on a vehicle or in a fixed facility (e.g., a factory), a robotics system, a surveillance system, or any other suitable device and/or system.

The imaging module 1010 includes a transmitter unit 1014, a receiver unit 1016, and a controller 1012. During operation, the transmitter unit 1014 may emit an emitted light 1003 toward a target object 1002. The receiver unit 1016 may receive reflected light 1005 reflected from the target object 1002. The controller 1012 may drive at least the transmitter unit 1014 and the receiver unit 1016. In some implementations, the receiver unit 1016 and the controller 1012 are implemented on one semiconductor chip, such as a system-on-a-chip (SoC). In some cases, the transmitter unit 1014 is implemented by two different semiconductor chips, such a laser emitter chip on III-V substrate and a Si laser driver chip on Si substrate.

The transmitter unit 1014 may include one or more light sources, control circuitry controlling the one or more light sources, and/or optical structures for manipulating the light emitted from the one or more light sources. In some embodiments, the light source may include one or more light emitting diodes (LEDs) or vertical-cavity surface-emitting lasers (VCSELs) emitting light that can be absorbed by the absorption region in the photo-detecting apparatus. For example, the one or more LEDs or VCSELs may emit light with a peak wavelength within a visible wavelength range (e.g., a wavelength that is visible to the human eye), such as 570 nm, 670 nm, or any other applicable wavelengths. For another example, the one or more LEDs or VCSEL may emit light with a peak wavelength above the visible wavelength range, such as 850 nm, 940 nm, 1050 nm, 1064 nm, 1310 nm, 1350 nm, 1550 nm, or any other applicable wavelengths.

In some embodiments, the emitted light from the light sources may be collimated by the one or more optical structures. For example, the one or more optical structures may include one or more collimating lens.

The receiver unit 1016 may include one or more photo-detecting apparatus according to any embodiments as mentioned above. The receiver unit 1016 may further include a control circuitry for controlling the control circuitry and/or optical structures for manipulating the light reflected from the target object 1002 toward the one or more photo-detecting apparatus. In some implementations, the optical structure includes one or more lens that receives a collimated light and focuses the collimated light towards the one or more photo-detecting apparatus.

In some embodiments, the controller 1012 includes a timing generator and a processing unit. The timing generator receives a reference clock signal and provides timing signals to the transmitter unit 1014 for modulating the emitted light. The timing signals are also provided to the receiver unit 1016 for controlling the collection of the photo-carriers. The processing unit processes the photo-carriers generated and collected by the receiver unit 1016 and determines raw data of the target object 1002. The processing unit may include control circuitry, one or more signal processors for processing the information output from the photo-detecting apparatus, and/or computer storage medium that may store instructions for determining the raw data of the target object or store the raw data of the target object 1002. As an example, the controller in an i-ToF sensor determines a distance between two points by using the phase difference between light emitted by the transmitter unit 1014 and light received by the receiver unit 1016.

The software module 1020 may be implemented to perform in applications, such as facial recognition, eye-tracking, gesture recognition, 3-dimensional model scanning/video recording, motion tracking, autonomous vehicles, and/or augmented/virtual reality.

Figure 10B:
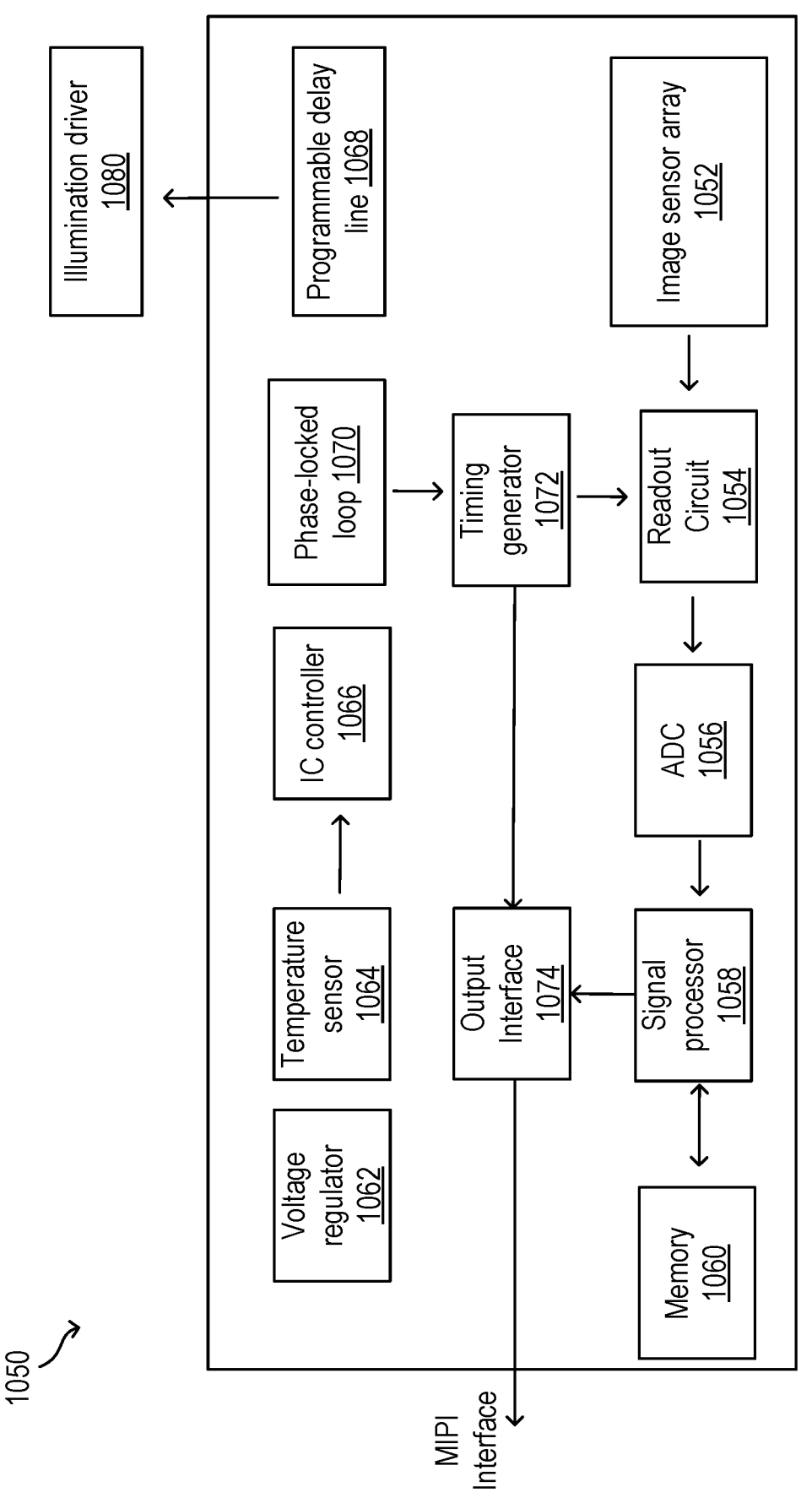
FIG. 10B shows a block diagram of an example receiver unit or controller.

FIG. 10B shows a block diagram of an example device 1050, e.g., the receiver unit 1016 or the controller 1012. Here, an image sensor array 1052 (e.g., 240×620-pixel array) may be implemented using any implementations of the photo-detecting apparatus described in this present disclosure. A phase-locked loop (PLL) circuit (e.g., an integer-N PLL) may generate a clock signal (e.g., four-phase system clocks) for modulation and demodulation. Before sending to the image sensor array 1052 and external illumination driver 1080, these clock signals may be gated and/or conditioned by a timing generator 1072 for a preset integration time and different operation modes. A programmable delay line 1068 may be added in the illumination driver path to delay the clock signals.

A voltage regulator 1062 may be used to control an operating voltage of the image sensor. For example, N voltage domains may be used for an image sensor. A temperature sensor 1064 may be implemented for the possible use of depth calibration and power control, and the temperature sensor 1064 may be controlled by integrated circuits (ICs) controller 1066.

The readout circuit 1054 of the photo-detecting apparatus bridges each of the photo-detecting apparatus of the image sensor array 1052 to a column analog-to-digital converter (ADC) 1056, where the ADC outputs may be further processed and integrated in the digital domain by a signal processor 1058 before reaching an output interface 1074 that is coupled to the timing generator. In some embodiments, the readout circuit 1054 may be in a three-transistor configuration including a reset gate, a source-follower, and a selection gate, or in a four-transistor configuration including an additional transfer gate, or any suitable circuitry for processing collected charges.

A memory 1060 may be used to store the outputs by the signal processor 1058. In some implementations, the output interface 1074 may be implemented using a 2-lane, 1.2 Gb/s D-PHY mobile industry processor interface (MIPI) transmitter coupled to an MIPI interface, or using complementary metal-oxide-semiconductor (CMOS) outputs for low-speed/low-cost systems. The digital data further conditioned by the signal processor 1058 is sent out through an MIPI interface for further processing.

An inter-integrated circuit (I2C) interface may be used to access all of the functional blocks described here.

In some embodiments, a bandgap of a substrate (e.g., any one of 120, 220, 320, 420, 520 in FIGS. 1A-1B, FIGS. 2A-2C, FIGS. 3A-3C, FIGS. 4A-4B, FIGS. 5A-5B, 6A-6E, or 7A-7E, 820 in FIGS. 8A-8C, or 910 in FIGS. 9A-9D) is greater than a bandgap of an absorption region (e.g., any one of 110, 210, 310, 410, 510 in FIGS. 5A-5B, 6A-6E, or 7A-7E, 810 in FIGS. 8A-8C, or 910 in FIGS. 9A-9D). In some embodiments, the absorption region includes or is composed of a semiconductor material. In some embodiments, the substrate includes or is composed of a semiconductor material. In some embodiments, the absorption region includes or is composed of a Group III-V semiconductor material. In some embodiments, the substrate includes or is composed of a Group III-V semiconductor material. The Group III-V semiconductor material may include, but is not limited to, GaAs/AlAs, InP/InGaAs, GaSb/InAs, or InSb. For example, in some embodiments, the absorption region includes or is composed of InGaAs, and the substrate include or is composed of InP. In some embodiments, the absorption region includes or is composed of a semiconductor material including a Group IV element. For example, Ge, Si or Sn. In some embodiments, the absorption region includes or is composed of the $Si_xGe_ySn_{1-x-y}$, where $0 \leq x \leq 1$, $0 \leq x+y \leq 1$. In some embodiments, the absorption region includes or is composed of $Ge_{1-a}Sn_a$, where $0 \leq a \leq 0.1$. In some embodiments, the absorption region includes or is composed of $Ge_xSi_{1-x}$, where $0 \leq x \leq 1$. In some embodiments, the absorption region composed of intrinsic germanium is of p-type due to material defects formed during formation of the absorption region, where the defect density is from $1 \times 10^{14}$ cm$^{-3}$ to $1 \times 10^{16}$ cm$^{-3}$. In some embodiments, the substrate includes or is composed of a semiconductor material including a Group IV element. For example, Ge, Si or Sn. In some embodiments, the substrate includes or is composed of the $Si_xGe_ySn_{1-x-y}$, where $0 \leq x \leq 1$, $0 \leq y \leq 1$, $0 \leq x+y \leq 1$. In some embodiments, the substrate includes or is composed of $Ge_{1-a}Sn_a$, where $0 \leq a \leq 0.1$. In some embodiments, the substrate includes or is composed of $Ge_xSi_{1-x}$, where $0 \leq x \leq 1$. For example, in some embodiments, the absorption region includes or is composed of Ge, and the substrate include or is composed of Si.

In some embodiments, the absorption region is doped with a graded doping profile. In some embodiments, the largest concentration of the graded doping profile is higher than the second peak doping concentration of the substrate or a low-barrier region (e.g., 610 in any one of FIGS. 6A-6E or FIGS. 7A, 7C-7E). In some embodiments, the smallest concentration of the graded doping profile is higher than the second peak doping concentration of the second dopant. In some embodiments, the graded doping profile can be graded from the first surface of the absorption region or from a second doped region (e.g., 508 in any one of FIGS. 5A-5B, 6A-6E, or 7A-7E) to the second surface of the absorption region. In some embodiments, the graded doping profile can be a gradual decrease/increase or a step like decrease/increase depending on the moving direction of the carriers. In some embodiments, the concentration of the graded doping profile is gradually deceased/increased from the first surface or the second doped region of the absorption region to the second surface of the absorption region depending on the moving direction of the carriers. In some embodiments, the concentration of the graded doping profile is gradually and radially deceased/increased from a center of the first surface or the second doped region of the absorption region to the second surface and to the side surfaces of the absorption region depending on the moving direction of the carriers. For example, if the absorption region is entirely over the substrate, the carriers with the first type, such as electrons when the first doped region is of n-type, move in the absorption region substantially along a direction from the first surface to the second surface, the concentration of the graded doping profile of the first dopant (e.g., boron) is gradually deceased from the first surface or from the second doped region of the absorption region to the second surface of the absorption region. In some embodiments, the concentration of the graded doping profile is gradually and laterally decreased/increased from an edge of the first surface or the second doped region of the absorption region to the side surfaces of the absorption region depending on the moving direction of the photo-carriers.

In some embodiments, the photo-detecting apparatus in the present disclosure further includes an optical element (not shown) over the pixel. In some embodiments, the photo-detecting apparatus in the present disclosure further includes N optical elements (not shown) over the N pixels. The optical element converges an incoming optical signal to enter the optical signal receiving region. In some embodiments, the optical elements include lenses.

In some embodiments, p-type dopant includes a group-III element. In some embodiments, p-type dopant is boron. In some embodiments, n-type dopant includes a group-V element. In some embodiments, n-type dopant is phosphorous.

In the present disclosure, if not specifically mentioned, the absorption region is configured to absorb photons having a peak wavelength in an invisible wavelength range equal to or greater than 800 nm, such as 850 nm, 940 nm, 1050 nm, 1064 nm, 1310 nm, 1350 nm, or 1550 nm or any suitable wavelength range. In some embodiments, the absorption region receives an optical signal and converts the optical signal into electrical signals. The absorption region can be in any suitable shape, such as, but not limited to, cylinder, rectangular prism.

In the present disclosure, if not specifically mentioned, the absorption region has a thickness depending on the wavelength of photons to be detected and the material of the absorption region. In some embodiments, when the absorption region includes germanium and is designed to absorb photons having a wavelength equal to or greater than 800 nm, the absorption region has a thickness equal to or greater than 0.1 μm. In some embodiments, the absorption region includes germanium and is designed to absorb photons having a wavelength between 800 nm and 2000 nm, the absorption region has a thickness between 0.1 μm and 2.5 μm. In some embodiments, the absorption region has a thickness between 1 μm and 2.5 μm for higher quantum efficiency. In some embodiments, the absorption region may be grown using a blanket epitaxy, a selective epitaxy, or other applicable techniques.

In some embodiments, the light shield is on a second surface of the substrate distant from the absorption region when an incident light enters the absorption region from the second surface of the substrate. In some embodiments, a shape of the optical window can be ellipse, circle, rectangular, square, rhombus, octagon or any other suitable shape from a top view of the optical window.

In the present disclosure, if not specifically mentioned, in a same pixel, the type of the carriers collected by the carrier-collection region of one of the switches and the type of the carriers collected by the carrier-collection region of the other switch are the same. For example, when the photo-detecting apparatus is configured to collect electrons, when a first switch is switched on and a second switch is switched off, the carrier-collection region in the first switch collects electrons of the photo-carriers generated from the absorption region, and when the second switch is switched on and the first switch is switched off, the carrier-collection region in the second switch also collects electrons of the photo-carriers generated from the absorption region.

In the present disclosure, if not specifically mentioned, the term electrode, includes metals or alloys. For example, a first electrode, a second electrode, a readout electrode, or a control electrode can include Al, Cu, W, Ti, Ta—TaN—Cu stack or Ti—TiN—W stack.

As used herein, the terms such as "first", "second", "third", "fourth" and "fifth" describe various elements, components, regions, layers and/or sections, these elements, components, regions, layers and/or sections should not be limited by these terms. These terms may be only used to distinguish one element, component, region, layer or section from another. The terms such as "first", "second", "third", "fourth" and "fifth" when used herein do not imply a sequence or order unless clearly indicated by the context. The terms "photo-detecting", "photo-sensing", "light-detecting", "light-sensing" and any other similar terms can be used interchangeably.

Spatial descriptions, such as "above", "top", and "bottom" and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

As used herein, the term "intrinsic" means that the semiconductor material is without intentionally adding dopants.

As used herein and not otherwise defined, the terms "substantially" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A photo-detecting apparatus, comprising:
   a pixel comprising an absorption region configured to receive an optical signal and to generate photo-carriers in response to the optical signal, wherein the absorption region includes a first material, wherein the first material comprises germanium;

a substrate supporting the absorption region, wherein the substrate includes a second material different from the first material, wherein the second material comprises silicon;

a light shield comprising an optical window; and one or more density compensation structures comprising a third material and arranged to provide a predetermined density distribution of the first material and the third material, wherein the third material comprises germanium, wherein the optical window is arranged over the absorption region such that the absorption region receives the optical signal through the optical window, wherein the light shield is arranged over the one or more density compensation structures to block light from entering the one or more density compensation structures, and wherein a total area of the absorption region and the one or more density compensation structures is at least 20% of an area of the pixel.

2. The photo-detecting apparatus of claim 1, further comprising an isolation region formed in the substrate.

3. The photo-detecting apparatus of claim 2, wherein the isolation region surrounds the absorption region, and the isolation region is between the absorption region and the one or more density compensation structures.

4. The photo-detecting apparatus of claim 2, wherein the isolation region surrounds the absorption region and the one or more density compensation structures.

5. The photo-detecting apparatus of claim 1, wherein the third material comprises a metal or an insulating material.

6. The photo-detecting apparatus of claim 1, wherein the one or more density compensation structures comprise multiple additional regions arranged around the absorption region.

7. The photo-detecting apparatus of claim 1, wherein the absorption region is doped with a first dopant having a first conductivity type, and the one or more density compensation structures are doped with a second dopant having the first conductivity type.

8. The photo-detecting apparatus of claim 1, further comprising a blocking layer surrounding the one or more density compensation structures.

9. The photo-detecting apparatus of claim 1, further comprising an isolation structure arranged to lower or prevent signal cross-talk between adjacent pixels, the isolation structure comprising an oxide material, a nitride material, or a silicon material.

10. A photo-detecting apparatus, comprising:

two adjacent pixels each comprising an absorption region configured to receive an optical signal and to generate photo-carriers in response to the optical signal, wherein the absorption region includes a first material, wherein the first material comprises germanium;

a substrate supporting the two adjacent pixels, wherein the substrate includes a second material different from the first material, wherein the second material comprises silicon;

a light shield comprising two optical windows;

one or more density compensation structures comprising a third material and arranged to provide a predetermined density distribution of the first material and the third material, wherein the third material comprises germanium; and two isolation regions each surrounding a respective absorption region of the absorption regions of the two adjacent pixels, wherein each of the two optical windows is arranged over a respective absorption region of the two adjacent pixels such that the respective absorption region receives the optical signal through the optical window, and wherein the light shield is arranged over the one or more density compensation structures to block light from entering the one or more density compensation structures.

11. The photo-detecting apparatus of claim 10, wherein, for each of the two adjacent pixels, a total area of the absorption region and the one or more density compensation structures is at least 20% of an area of the pixel.

12. The photo-detecting apparatus of claim 10, wherein the third material comprises a metal or an insulating material.

13. The photo-detecting apparatus of claim 10, wherein one of the two isolation regions surrounds the one or more density compensation structures and the respective absorption region.

14. The photo-detecting apparatus of claim 10, wherein the absorption region is doped with a first dopant having a first conductivity type, and the one or more density compensation structures are doped with a second dopant having the first conductivity type.

15. The photo-detecting apparatus of claim 10, further comprising an isolation structure arranged to lower or prevent signal cross-talk between adjacent pixels, the isolation structure comprising an oxide material, a nitride material, or a silicon material.

16. A system, comprising:

a transmitter;

a receiver;

a signal processor in electrical communication with the receiver; and a controller in electrical communication with the signal processor and the transmitter;

wherein the receiver includes one or more photo-detecting apparatus, each of the one or more photo-detecting apparatus comprising:

a pixel comprising an absorption region configured to receive an optical signal and to generate photo-carriers in response to the optical signal, wherein the absorption region includes a first material, wherein the first material comprises germanium;

a substrate supporting the absorption region, wherein the substrate includes a second material different from the first material, wherein the second material comprises silicon;

a light shield comprising an optical window; and one or more density compensation structures comprising a third material and arranged to provide a predetermined density distribution of the first material and the third material, wherein the third material comprises germanium, wherein the optical window is arranged over the absorption region such that the absorption region receives the optical signal through the optical window, wherein the light shield is arranged over the one or more density compensation structures to block light from entering the one or more density compensation structures, and wherein a total area of the absorption region and the one or more density compensation structures is at least 20% of an area of the pixel.

17. The system of claim 16, wherein one of the one or more photo-detecting apparatus further comprises an isolation region formed in the substrate, wherein the isolation region surrounds the absorption region, and the isolation region is between the absorption region and the one or more density compensation structures.

18. The imaging system of claim 16, wherein one of the one or more photo-detecting apparatus further comprises an isolation region formed in the substrate, wherein the isolation region surrounds the absorption region and the one or more density compensation structures.

19. The system of claim 16, wherein the absorption region is doped with a first dopant having a first conductivity type, and the one or more density compensation structures are doped with a second dopant having the first conductivity type.

20. The system of claim 16, further comprising an isolation structure arranged to lower or prevent signal cross-talk between adjacent pixels, the isolation structure comprising an oxide material, a nitride material, or a silicon material.

* * * * *